US009379114B2

(12) United States Patent
Jeong et al.

(10) Patent No.: US 9,379,114 B2
(45) Date of Patent: Jun. 28, 2016

(54) SEMICONDUCTOR DEVICE AND METHOD OF FABRICATING THE SAME

(71) Applicants: Jin-Won Jeong, Seoul (KR); Wonchul Lee, Seongnam-si (KR)

(72) Inventors: Jin-Won Jeong, Seoul (KR); Wonchul Lee, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/732,353

(22) Filed: Dec. 31, 2012

(65) Prior Publication Data
US 2013/0256769 A1 Oct. 3, 2013

(30) Foreign Application Priority Data

Mar. 30, 2012 (KR) ........................ 10-2012-0032925

(51) Int. Cl.
H01L 27/108 (2006.01)
H01L 27/105 (2006.01)

(52) U.S. Cl.
CPC ...... *H01L 27/1052* (2013.01); *H01L 27/10808* (2013.01); *H01L 27/10852* (2013.01); *H01L 27/10855* (2013.01); *H01L 27/10876* (2013.01); *H01L 27/10885* (2013.01); *H01L 27/10894* (2013.01)

(58) Field of Classification Search
CPC ............................ H01L 21/8239; H01L 21/28
USPC ...................................................... 257/296
See application file for complete search history.

(56) References Cited

U.S. PATENT DOCUMENTS

| 5,780,338 | A  | * | 7/1998 | Jeng et al. ...................... 438/253 |
| 2005/0095794 | A1 |   | 5/2005 | Park |
| 2006/0081913 | A1 | * | 4/2006 | Kim ................................ 257/316 |
| 2007/0004170 | A1 | * | 1/2007 | Kawasaki et al. ............. 438/452 |
| 2008/0182399 | A1 |   | 7/2008 | Cho |
| 2009/0045465 | A1 |   | 2/2009 | Kim |
| 2009/0170301 | A1 |   | 7/2009 | Kang |
| 2009/0221137 | A1 | * | 9/2009 | Matsui .......................... 438/585 |
| 2010/0163976 | A1 |   | 7/2010 | Lee et al. |
| 2010/0176486 | A1 | * | 7/2010 | Miyajima et al. ............. 257/532 |
| 2010/0227463 | A1 |   | 9/2010 | Cho |
| 2011/0042732 | A1 |   | 2/2011 | Wang et al. |
| 2011/0147889 | A1 |   | 6/2011 | Tsuchiya |
| 2011/0151656 | A1 |   | 6/2011 | Fukushima |
| 2011/0195551 | A1 | * | 8/2011 | Kim .............................. 438/238 |

FOREIGN PATENT DOCUMENTS

| KR | 1020050113821 A | 12/2005 |
| KR | 1020100112901 A | 10/2010 |
| KR | 1020100132196 A | 12/2010 |
| KR | 1020110003040 A | 1/2011 |
| KR | 1020110013050 A | 2/2011 |
| KR | 1020110024494 A | 3/2011 |

* cited by examiner

*Primary Examiner* — Trung Q Dang
*Assistant Examiner* — Patricia Reddington
(74) *Attorney, Agent, or Firm* — Renaissance IP Law Group LLP

(57) ABSTRACT

Provided are a semiconductor device and a method of fabricating the same. The semiconductor device may include storage node pads disposed adjacent to each other between word lines but spaced apart from each other by an isolation pattern. Accordingly, it is possible to prevent a bridge problem from being caused by a mask misalignment. This enables to improve reliability of the semiconductor device.

18 Claims, 30 Drawing Sheets

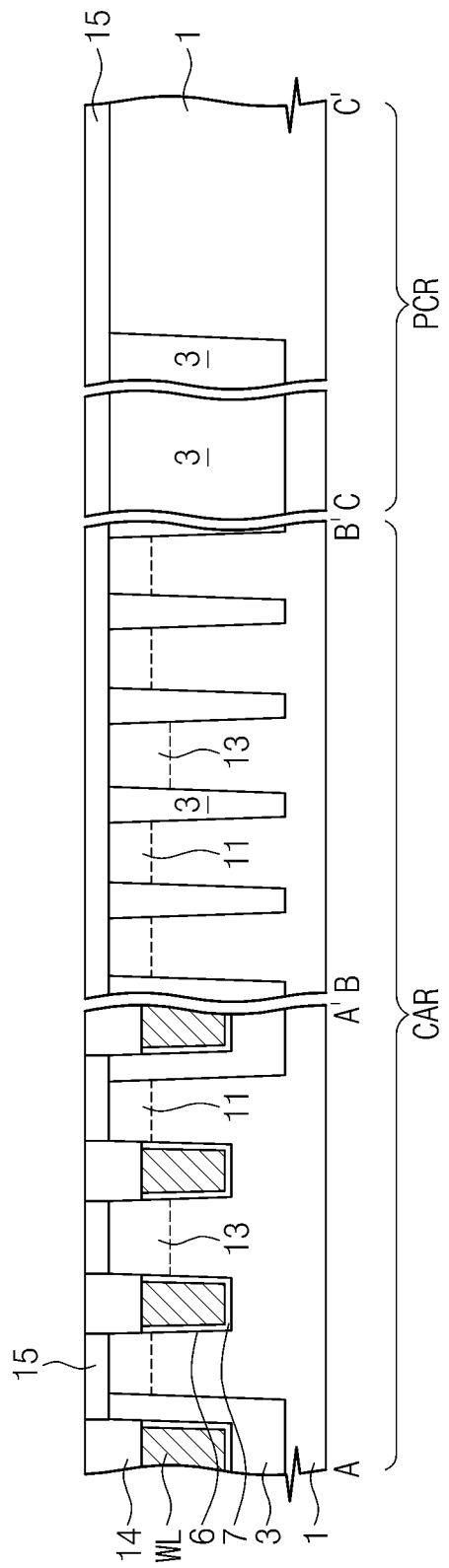

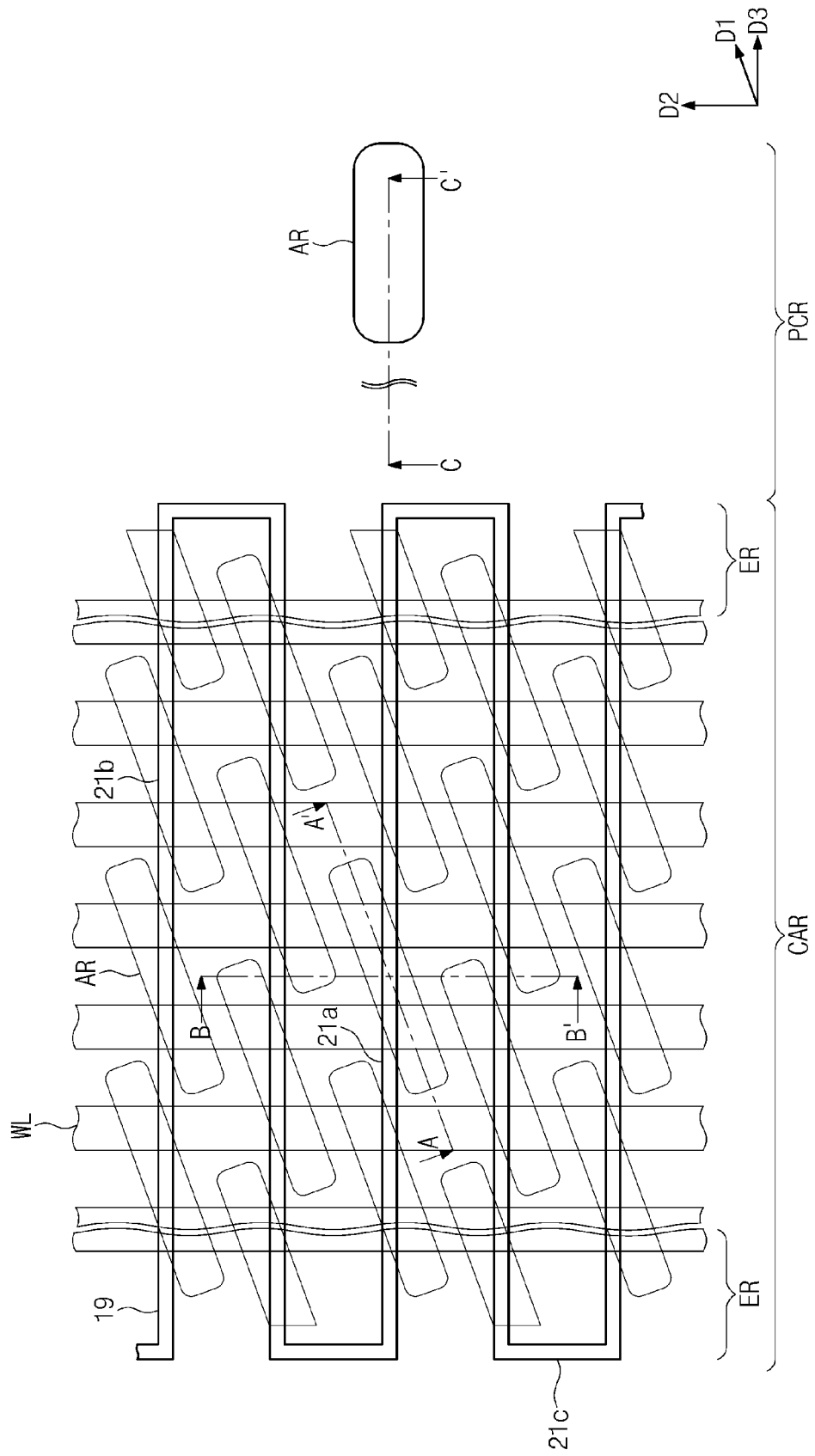

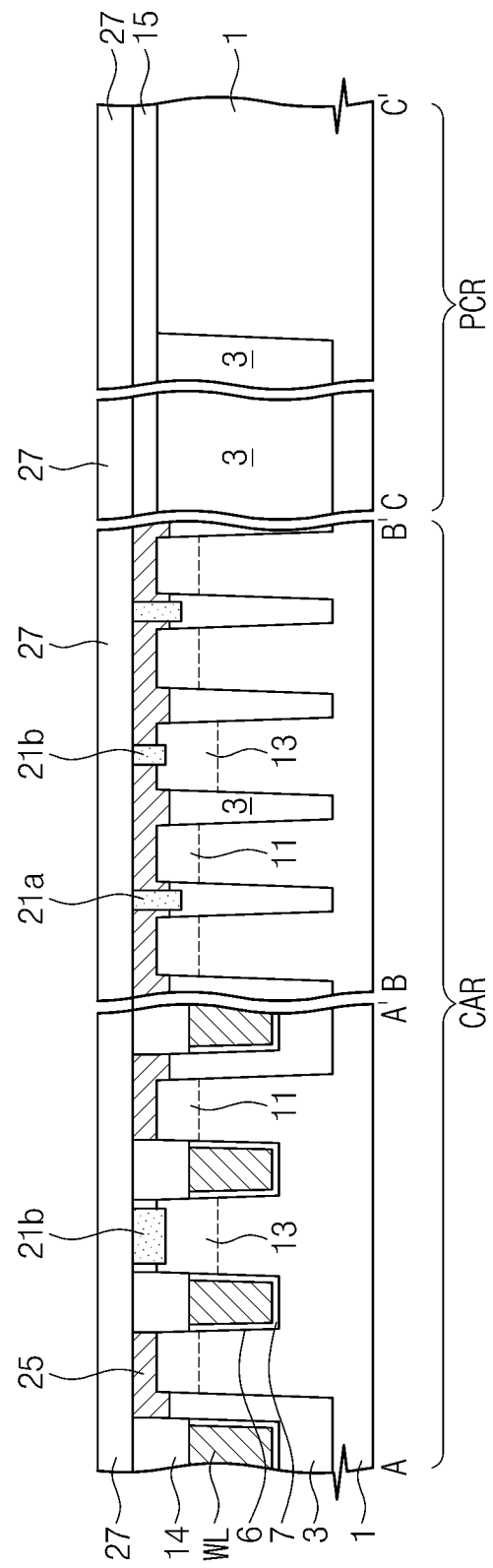

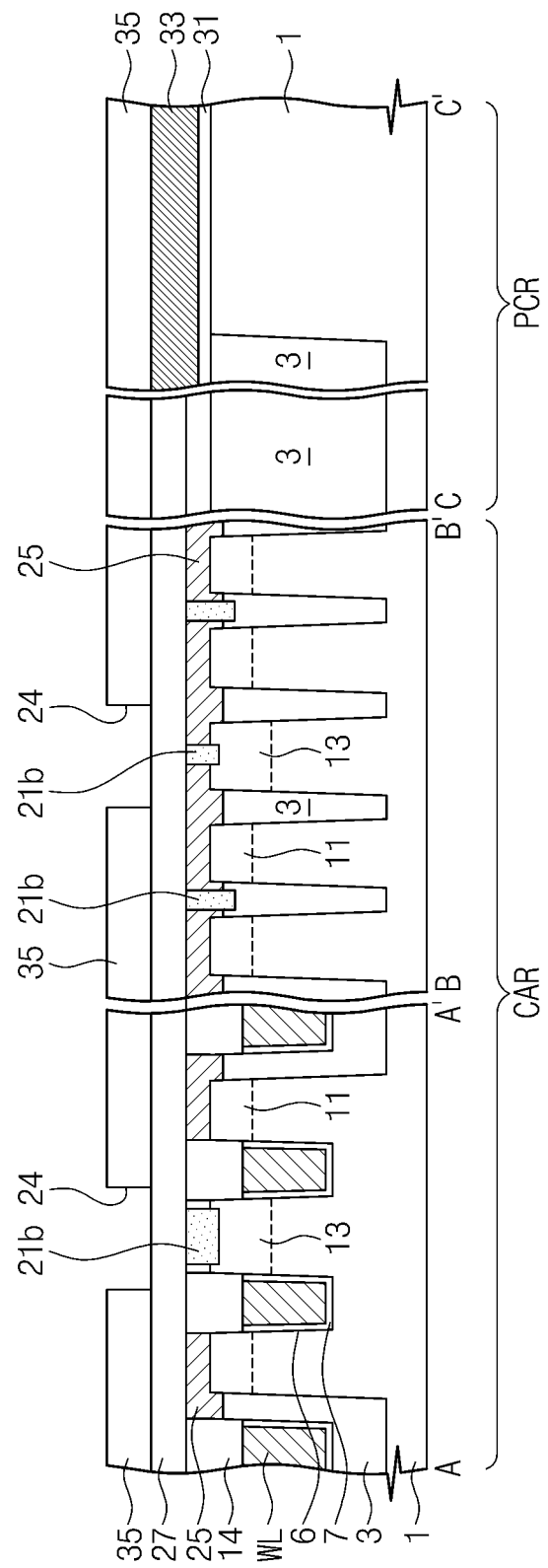

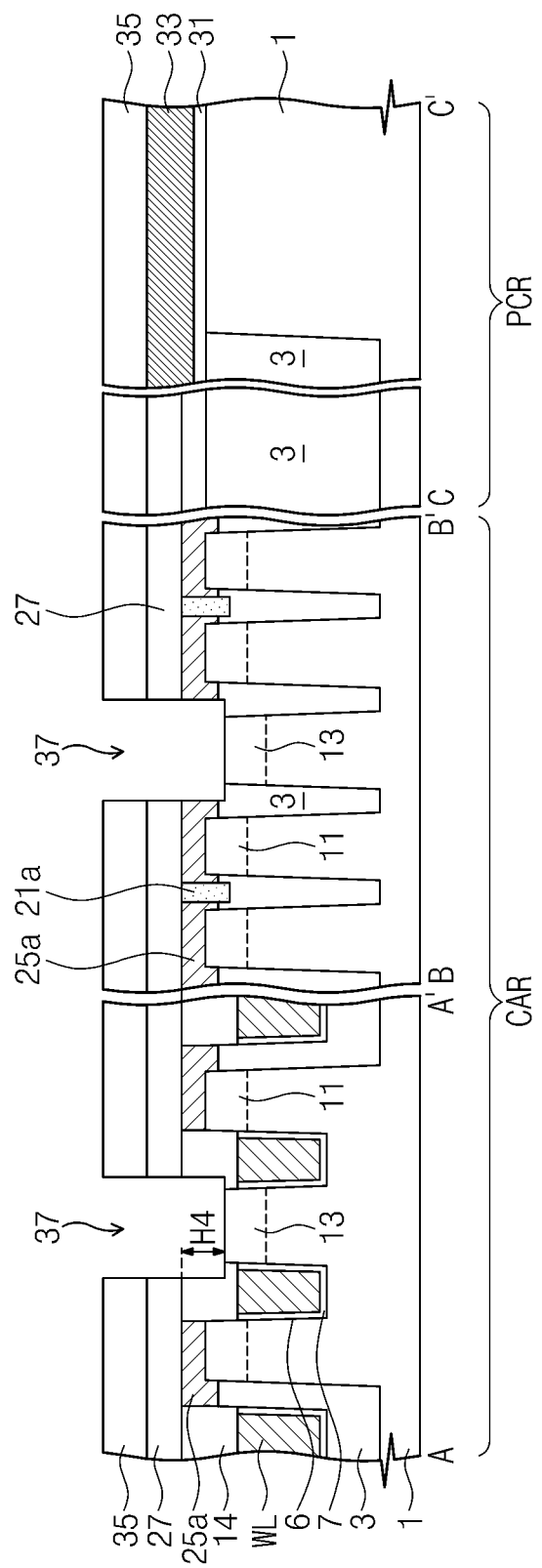

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0032925, filed on Mar. 30, 2012, in the Korean Intellectual Property Office, the entire contents of which are hereby incorporated by reference.

BACKGROUND

Embodiments of the inventive concepts relate to a semiconductor device and a method of fabricating the same.

Small multifunctional, and/or low-cost semiconductor devices are in great demand in the electronic industry for the production of popular consumer electronic devices such as smart phones. Higher integration of semiconductor devices is desirable to satisfy consumer demands for high performance and inexpensive electronic devices. In the case of semiconductor memory devices, increased integration is especially desirable, because their integration is an important factor in determining product prices. However, the extremely expensive process equipment needed to increase pattern fineness sets a practical limit on higher integration of semiconductor memory devices. To overcome such a hurdle, a variety of studies have been performed on developing on new technologies for increasing integration density of the semiconductor memory device.

SUMMARY

Embodiments of the inventive concepts provide a semiconductor device with a reduced contact resistance and an improved reliability.

Other embodiments of the inventive concepts provide a method of fabricating a highly-integrated semiconductor device, which can prevent a mask alignment or a contact pad bridge from occurring.

According to example embodiments of the inventive concepts, a semiconductor device may include a substrate, a device isolation layer provided in the substrate to have a top surface lower than that of the substrate, a memory element disposed on the substrate, and a first contact electrically connected to the memory element to be in contact with top and side surfaces of the substrate.

In example embodiments, an entire side surface of the first contact may be in contact with a silicon nitride layer.

In example embodiments, the number of the first contact may be two or more, and the device may further include an isolation pattern provided between adjacent ones of the first contacts.

In example embodiments, a top surface of the isolation pattern may be substantially coplanar with a top surface of the first contact.

In example embodiments, a bottom surface of the isolation pattern may be lower than the top surface of the substrate.

In example embodiments, the device may further include a word line capping layer pattern adjacent to the first contact, and a word line extending along a first direction below the word line capping layer pattern.

In example embodiments, the word line may be provided in the substrate.

In example embodiments, a top surface of the word line capping layer pattern may be substantially coplanar with that of the first contact.

In example embodiments, the isolation pattern has a bar-shape extending along a second direction crossing the first direction.

In example embodiments, a bottom surface of the isolation pattern may be higher than a bottom surface of the word line capping layer pattern.

In example embodiments, the isolation pattern divides a top surface of the word line capping layer pattern into a plurality of portions.

In example embodiments, the device may further include a second contact provided at a side of the first contact, and a spacer interposed between the first and second contacts. The spacer may also be referred to as a separation wall.

In example embodiments, a bottom surface of the second contact may be lower than a top surface of the device isolation layer.

In example embodiments, the device may further include an isolation pattern (or a separation wall) provided at other side of the first contact, and a conductive line extending along the first direction on the second contact. The conductive line may have the same width as the isolation pattern and overlaps the isolation pattern in plan view.

In example embodiments, the device may further include a first doped region provided in the substrate and connected to the first contact, and a second doped region provided in the substrate and connected to the second contact. The second doped region has a depth greater than that of the first doped region.

According to example embodiments of the inventive concepts, a semiconductor device may include a plurality of word lines provided in a substrate with a gate insulating layer interposed therebetween to extend along a first direction, word line capping layer patterns disposed on the word lines, respectively, to protrude upward from a top surface of the substrate, storage node pads disposed between the word line capping layer patterns to be in contact with the substrate, and isolation patterns disposed between the storage node pads and between the word line capping layer patterns.

In example embodiments, the storage node pads, the isolation patterns, and the word line capping layer patterns may have top surfaces substantially coplanar with each other.

In example embodiments, the semiconductor device may further include a device isolation layer in the substrate to define an active region. The isolation patterns may be in contact with the device isolation layer, and a top surface of the device isolation layer is lower than a top surface of the substrate and higher than a bottom surface of the isolation patterns.

In example embodiments, a sidewall of the substrate may be exposed by the device isolation layer, and the storage node pad may extend to cover a portion of a sidewall of the recess formed in the substrate and a top surface of the device isolation layer.

In example embodiments, the semiconductor device may further include a bit line node contact being in contact with the substrate between the word lines and being spaced apart from the isolation pattern, and a bottom surface of the bit line node contact may be lower than the top surface of the device isolation layer.

In example embodiments, the semiconductor device may further include an insulating spacer interposed between the bit line node contact and the storage node pad.

In example embodiments, the semiconductor device may further include a bit line disposed on the bit line node contact. The bit line may be overlapped with the isolation patterns, from a plan view.

In example embodiments, the semiconductor device may further include a storage node contact in contact with the storage node pad and a memory element electrically connected to the storage node contact.

In example embodiments, the substrate may include a cell array region, a cell edge region, and a peripheral circuit region, and the semiconductor device may further include a dummy bit line node contact and a dummy isolation pattern, which may be disposed adjacent to each other in the cell edge region.

In example embodiments, the dummy isolation pattern may have a 'U'-shaped structure.

In example embodiments, one dummy isolation pattern may be overlapped, in common, with two adjacent ones of the bit lines.

In example embodiments, the dummy isolation pattern may be disposed closer to an outer edge of the cell edge region, compared with the dummy bit line node contact.

According to example embodiments of the inventive concepts, a method of fabricating a semiconductor device may include forming a mask pattern on a substrate; forming a plurality of first grooves in the substrate using the mask pattern as an etch mask to extend along a first direction; forming word lines in the first grooves, respectively; forming a word line capping layer pattern on the word line to protrude upward from a top surface of the substrate; etching the mask pattern and the word line capping layer pattern to form a plurality of second grooves extending along a second direction crossing the first direction and exposing the substrate; forming isolation patterns to fill the second grooves; removing the mask pattern to expose the substrate; and forming a first contact to be in contact with the substrate between the isolation patterns and between the word line capping layer patterns.

In example embodiments, the forming of the first contact may include forming a conductive layer on the substrate to fill spaces between the isolation patterns and between the word line capping layer patterns, and then, performing a planarization process to expose the isolation patterns and the word line capping layer patterns.

In example embodiments, the forming of the isolation pattern may include forming an isolation layer on the substrate to fill the second groove, and then, performing a planarization process to expose top surfaces of the word line capping layer pattern and the mask pattern.

In example embodiments, the method may further include forming a device isolation layer in the substrate to define an active region, before the formation of the mask pattern. Here, the forming of the second groove may include removing upper portions of the substrate and the device isolation layer to form a first recess region and a second recess region on the substrate and the device isolation layer, respectively. The depth of the first recess region may be lower than that of the second recess region.

In example embodiments, the isolation patterns may include a first isolation pattern provided in the first recess region and a second isolation pattern provided in the second recess region, and a bottom surface of the first isolation pattern may be lower than that of the second isolation pattern.

In example embodiments, the method may further include removing the first isolation pattern and a portion of the first contact adjacent thereto to form a hole exposing the substrate, after the formation of the first contact, forming a first spacer to cover a sidewall of the hole but expose the substrate, and forming a second contact to fill the hole.

In example embodiments, a bottom surface of the hole may be lower than that of the first isolation pattern.

In example embodiments, the removing of the mask pattern may include partially removing an upper portion of the device isolation layer. Here, a top surface of the device isolation layer may be higher than a bottom surface of the first isolation pattern.

In example embodiments, the substrate may include a cell edge region, and in the cell edge region, at least two adjacent ones of the second grooves may be formed to be connected to each other.

BRIEF DESCRIPTION OF THE DRAWINGS

Example embodiments will be more clearly understood from the following description made in conjunction with the accompanying drawings. The accompanying drawings represent non-limiting, example embodiments as described herein.

FIGS. 2A, 3A, 4A, 5A, and 6A are plan views sequentially illustrating a process of forming the semiconductor device of FIG. 1A.

FIGS. 2B, 3B, 3C, 3D, 3E, 3F, 4B, 4C, 5B, 5C, 5D, 5E, 6B, 6C, 6D, 6E, 6F, 6G, and 6H are cross-sectional views sequentially illustrating the process of forming the semiconductor device of FIG. 1A.

Figure 1A:
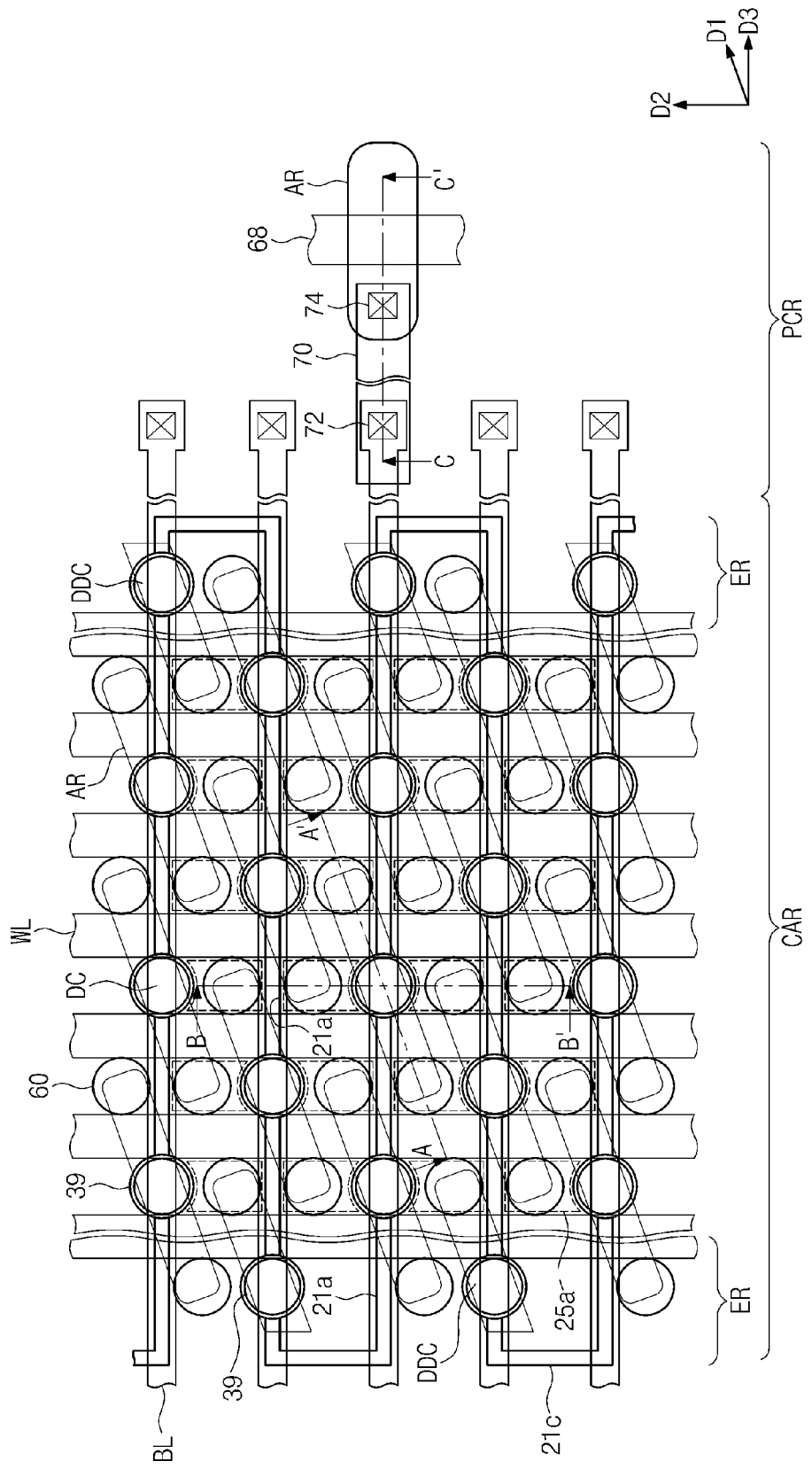
FIG. 1A is a plan view of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings. The inventive concepts may, however, be embodied in many different forms and should not be construed as being limited to the specific embodiments set forth herein; rather, these embodiments are provided so that this disclosure will be thorough and complete, and will fully convey the inventive concepts to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to schematic plan, perspective, and cross-cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
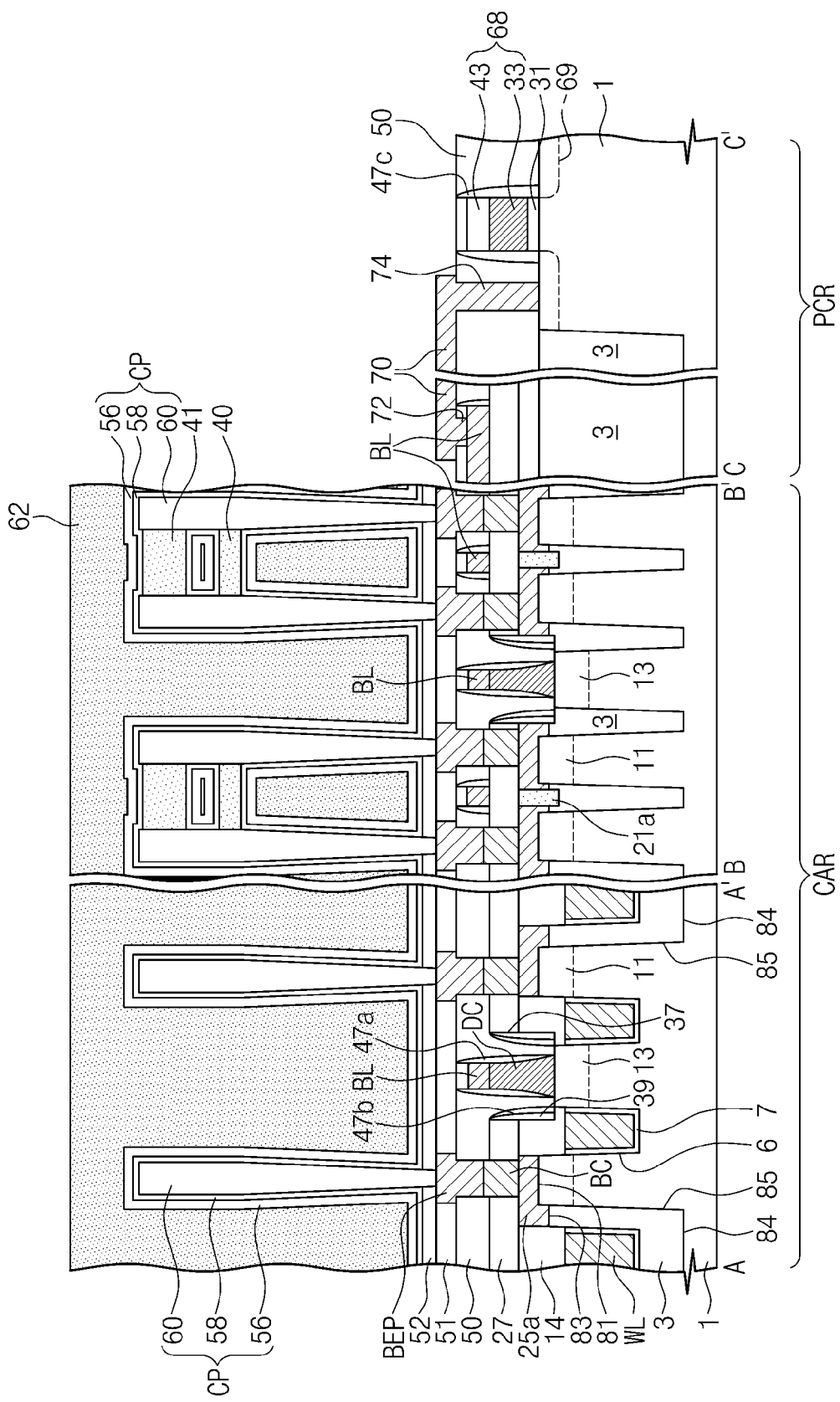
FIG. 1B is a cross-sectional view of a semiconductor device according to one embodiment of the inventive concept, taken along lines A-A', B-B', and C-C' of FIG. 1A.

FIG. 1A is a plan view of a semiconductor device according to example embodiments of the inventive concept, and FIG. 1B is a cross-sectional view of a semiconductor device according to one embodiment of the inventive concept, taken along lines A-A', B-B', and C-C' of FIG. 1A.

Referring to FIGS. 1A and 1B, a substrate 1 may include a cell array region CAR and a peripheral circuit region PCR. The cell array region CAR may include a cell edge region ER, in which dummy patterns may be disposed. A device isolation layer 3 may be provided in a recess or trench 84 formed in the substrate 1 to define at least one active region AR. In plan view, the active region AR may be shaped like a bar elongated along a first direction D1, and in example embodiments, the at least one active region AR may include a plurality of active regions, which may be spaced apart from and parallel to each other. A plurality of word lines WL may be provided on the substrate 1 to cross the active region AR and the device isolation layer 3. For example, the word lines WL may extend along a second direction D2. The word lines WL may be formed of a conductive material such as doped polysilicon, metal silicide, and/or a metal. The second direction D2 may not be parallel to the first direction D1. The word lines WL may be provided in a recessed region R. Top surfaces of the word lines WL may be lower than a top surface of the substrate 1. Hereinafter, each of the word lines WL may be referred as to a cell gate pattern. A gate insulating layer 7 may be interposed between the word lines WL and the substrate 1. A first doped region 11 may be provided in the substrate 1 at one side of the word line WL, and a second doped region 13 may be provided in the substrate 1 at another side of the word line WL. The second doped region 13 may be interposed between two adjacent word lines WL. The second doped region 13 may have a bottom surface positioned at a lower level than that of the first doped region 11. In some embodiments, the bottom surface of the second doped region 13 may be positioned at substantially the same level as that of the first doped region 11.

A first word line capping layer pattern 14 may be provided on the word lines WL. The first word line capping layer pattern 14 may protrude from the top surface of the substrate 1. For example, a top surface of the first word line capping layer pattern 14 may be higher than that of the substrate 1. The first word line capping layer pattern 14 may comprise, for example, silicon nitride, silicon oxynitride, silicon oxide or combinations thereof. Storage node pads 25a may be in contact with the first doped region 11, between adjacent ones of the word line capping layer patterns 14. In addition, isolation patterns 21a may be provided between adjacent storage node pads 25a and overlie the device isolation layer 3. The isolation pattern 21a may be formed of the same material as the word line capping layer patterns 14. The isolation pattern 21a, the storage node pads 25a, and the first word line capping layer pattern 14 may have top surfaces that are substantially coplanar with each other according to an embodiment of the inventive concepts.

The storage node pads 25a may be spaced apart from each other by the isolation pattern 21a. In plan view, the storage node pads 25a may be rectangular-shaped but may also include a curved portion adjacent to a bit line node contact DC. According to example embodiments of the inventive concepts, each of the storage node pads 25a may have a bottom surface larger than that of the conventional storage node pad (i.e., a cylindrical storage node pad). For example, the area of the storage node pad 25a in contact with the active region AR may be increased by about 1.37 times, compared with that of the conventional or cylindrical storage node pad. Accordingly, it is possible to reduce contact resistance between the storage node pad 25a and the first doped region 11.

A top surface of the device isolation layer 3 may be lower than that of the substrate 1 and higher than a bottom surface of the isolation pattern 21a. A height difference between the top surfaces of the device isolation layer 3 and the substrate 1 may be less than about 80 Å.

In some embodiments, the storage node pads 25a may extend to cover a portion of a sidewall of the recess 84 formed in the substrate 1 and the top surface of the device isolation layer 3. As shown in the section B-B' of FIG. 1B, the storage node pad 25a may be formed to cover both side surfaces a protruding portion of the substrate 1. This increases a contact area between the storage node pad 25a and the substrate 1.

In the present embodiment, since the word lines WL are provided in the recessed region 6, a cell transistor may have a recessed channel region. This can reduce short channel effects and decrease a leakage current in a highly integrated semiconductor device.

In the cell array region CAR, a first insulating layer 27 may be provided on the substrate 1. A bit line BL may be provided on the first insulating layer 27 to extend along a third direction D3 crossing both of the first and second directions D1 and D2. The bit line BL may overlap with the isolation patterns 21a in cross-sectional view. The bit line BL may be a metal-containing layer. A width of the bit line BL may be substantially equal to a width of the isolation pattern 21a. In addition, the bit line BL and the isolation pattern 21a may be overlap each other vertically. Sidewalls of the bit line BL and the isolation pattern 21a may be aligned with each other.

The bit line BL may be electrically connected to the second doped region 13 via the bit line node contact DC. The bit line node contact DC may include, for example, metal silicide, doped polysilicon, metal nitride, a metal, and combinations thereof. An upper width of the bit line node contact DC may be substantially equal to the width of the bit line BL. The bit line node contact DC may be provided in a bit line node hole 37, which may be formed by etching the first insulating layer 27, a portion of the first word line capping layer pattern 14, and a portion of the substrate 1. A bottom surface of the bit line node hole 37 or a bottom surface of the bit line node contact DC may be lower than the top surface of the device isolation layer 3.

A sidewall of the bit line node hole 37 may be covered with a first spacer 39. In example embodiments, the first spacer 39 may have a thickness ranging from about 30 Å to about 300 Å. The first spacer 39 with this thickness allows the storage node pad 25 to be effectively separated electrically from the bit line node contact DC. Sidewalls of the bit line BL and the bit line node contact DC may be covered with a second spacer 47a. A sidewall of the first spacer 39 may be covered with a third spacer 47b. The first, second and third spacers 39, 47a, and 47b may be formed of at least one layer selected from the group consisting of a silicon nitride layer, a silicon oxynitride layer, and a silicon oxide layer. The sidewall of the second spacer 47a may be spaced apart from the sidewall of the third spacer 47b.

According to example embodiments of the inventive concepts, as shown in FIGS. 1A and 1B, the first word line capping layer pattern 14, the isolation pattern 21a, and the first spacer 39 may be provided on sidewalls of the storage node pad 25a. Therefore, if the first word line capping layer pattern 14, the isolation pattern 21a, and the first spacer 39 are formed of the same material (e.g., a silicon nitride layer), the sidewalls of the storage node pad 25a may be covered with the same material.

Referring to the plan view shown in FIG. 1A, a dummy bit line node contact DDC may be provided in the cell edge region ER. The dummy bit line node contact DDC may have the same shape as the bit line node contact DC but may be provided for a different purpose from that of the bit line node contact DC. In addition, a dummy isolation pattern 21c may be provided in the cell edge region ER. The dummy isolation pattern 21c may be disposed at the outermost region of the cell edge region ER (e.g., outside the dummy bit line node contact DDC). For example, the dummy isolation pattern 21c may be disposed closer to an outer edge of the cell edge region ER, than to the dummy bit line node contact DDC. The dummy isolation pattern 21c may be formed of the same material as the isolation pattern 21a. The dummy isolation pattern 21c may be shaped like a letter 'U'. The dummy isolation pattern 21c may overlap adjacent bit lines. The dummy isolation pattern 21c may connect neighboring ones of the dummy bit line node contacts DDC.

Referring back to FIG. 1B, a second insulating layer 50 may be provided on the first insulating layer 27. The second insulating layer 50 may extend between the second spacer 47a and the third spacer 47b and cover sidewalls of the second spacer 47a and the third spacer 47b. A storage node contact BC may be connected to the storage node pads 25a through the first and second insulating layers 27 and 50. The storage node contact BC may include at least one material selected from the group consisting of a metal silicide layer, a polysilicon layer, a metal nitride layer, and a metal layer. A lower electrode pad BEP may be provided on the second insulating layer 50. The lower electrode pad BEP may penetrate at least a portion of the second insulating layer 50 and thus be connected to the storage node contact BC. In some embodiments, some or all of the storage node pads 25a, the storage node contact BC, and the lower electrode pad BEP may be collectively referred to as a contact. In this case, the contact may be considered as including an upper portion, e.g., the storage node contact BC and a lower portion, e.g., the storage node pad 25a, and the upper portion may be contiguous with the lower portion.

In the peripheral circuit region PCR, a peripheral circuit gate electrode 68 may be provided on the substrate 1. The peripheral gate electrode 68 may include a first gate layer 33 and a second gate layer 43 stacked sequentially. The first gate layer 33 may be a polysilicon layer, while the second gate layer 43 may be a metal-containing layer. The second gate layer 43 may include the same material as the bit line BL. In other words, gate electrodes in the peripheral circuit region may be formed of the same material as the bit line BL in the cell array region, and thus, there is no need to perform an additional deposition process for the gate electrode. This simplifies the fabrication process and reduces an interlayer thickness. A sidewall of the peripheral gate electrode 68 may be covered with a fourth spacer 47c. Top surfaces of the bit line BL and the peripheral gate electrode 68 may be covered with a second word line capping layer pattern 45. The second to fourth spacers 47a, 47b, and 47c may be formed of the same material.

A peripheral doped region 69 may be provided in the substrate 1 on both sides of the peripheral gate electrode 68. The substrate 1 of the peripheral circuit region PCR may be covered with the second insulating layer 50. The bit line BL may be electrically connected to the peripheral doped region 69 through a first peripheral contact 72 penetrating the second word line capping layer pattern 45, a peripheral wire 70 disposed on the second insulating layer 50, and a second peripheral contact 74 penetrating the second insulating layer 50. The first peripheral contact 72, the second peripheral contact 74, and the peripheral wire 70 may be connected with each other to form a single interconnection pattern. The first peripheral contact 72, the second peripheral contact 74, and the peripheral wire 70 may be formed of the same material as the lower electrode pad BEP.

In the cell array region CAR, a third insulating layer 51 may be provided on the second insulating layer 50. The third insulating layer 51 may be formed of the same material as the first and second insulating layers 27 and 50. An etch stop layer 52 may be provided on the third insulating layer 51 and include an opening to expose the lower electrode pad BEP. A memory element may be provided on the lower electrode pad BEP. In the present embodiment, the memory element may be a capacitor CP, and the semiconductor device may be a DRAM device. For example, a lower electrode 60 may be provided on the third insulating layer 51 in the cell array region CAR. The lower electrode 60 may be electrically connected to the lower electrode pad BEP through the etch stop layer 52. The lower electrode pad BEP may, for example, be shaped like a plug or a pillar. At least one supporting layer may be provided to support a sidewall of the lower electrode 60. For example, the at least one supporting layer may include first and second supporting patterns 40 and 41 vertically spaced apart from each other, as shown in FIG. 1B. The supporting patterns 40 and 41 may be disposed to support sidewalls of at least two adjacent lower electrodes 60. In plan view, a shape of each of the supporting patterns 40 and 41 may be modified. With the supporting patterns 40 and 41, it is possible to substantially prevent the lower electrodes 60 from leaning.

A dielectric 58 may be provided to conformally cover exposed surfaces of the lower electrode 60 and the supporting patterns 40 and 41. The dielectric 58 may include a high-k dielectric layer (e.g., metal oxide). The dielectric 58 may be conformally covered with an upper electrode layer 56. The lower electrode 60, the dielectric 58, and the upper electrode layer 56 may constitute the capacitor CP serving as the memory element. For example, the upper electrode layer 56 may include a titanium nitride layer. The upper electrode layer 56 may be covered with a plate electrode layer 62. The plate electrode layer 62 may include, for example, tungsten. In various embodiments, the plate electrode layer 62 may fill spaces between the lower electrodes 60, between the supporting patterns 40 and 41, and between the lower electrode 60 and the supporting patterns 40 and 41 adjacent thereto.

In the semiconductor device according to the present embodiment, the storage node pads 25, which are disposed adjacent to each other between the word lines WL, may be separated from each other by the isolation pattern 21a. As a result, it is possible to increase contact areas between the storage node pads 25a and the first doped region 11. In addition, the storage node pads 25a may extend to cover a side surface of the first doped region 11 to increase the contact area and decrease contact resistance between the storage node pad 25a and the first doped region 11.

In some embodiments, a semiconductor device may include a substrate 1 having a recess (or trench) 84 partially defined by a sidewall 85 (FIG. 1B). One skilled in the art will appreciate how the recess 84 is formed using techniques such as shallow trench isolation. The substrate 1 has a top surface 81. The semiconductor device may include a device isolation layer 3 formed in the recess 84. The device isolation layer 3 may have a top surface 83 lower than the top surface 81 of the substrate 1. A memory element, e.g., CP, may be disposed over the substrate 1. One or more storage node pads 25a are electrically connected to the memory element. At least one of the storage node pads 25a may be in contact with the top surface 81 of the substrate 1 and may be formed adjacent to the sidewall 85 of the recess 84. In some embodiments, the storage node pads 25a may extend to cover a portion of the sidewall 85.

Figure 1C:
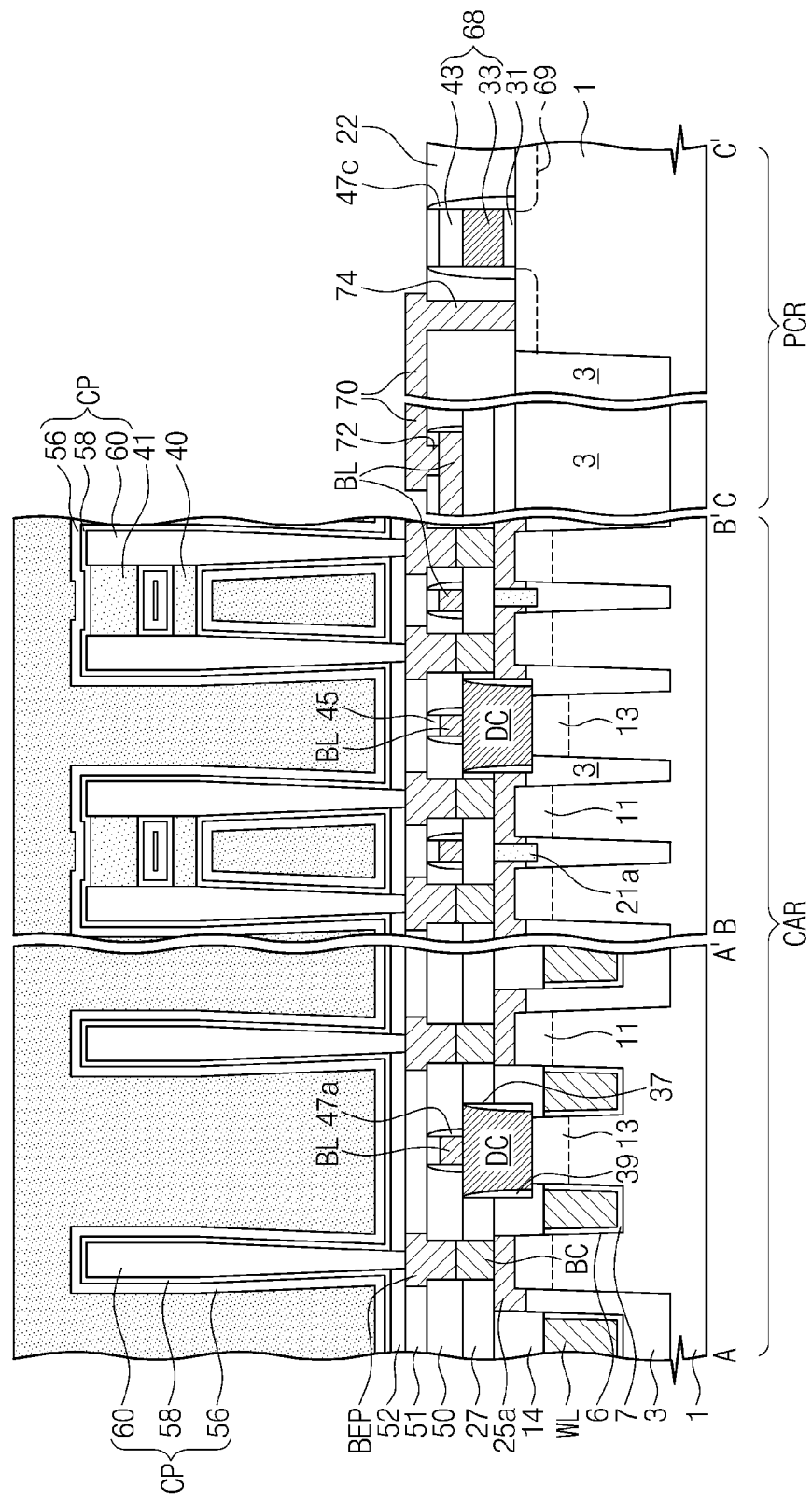
FIG. 1C is a cross-sectional view of a semiconductor device according to another embodiment of the inventive concept, taken along lines A-A', B-B', and C-C' of FIG. 1A.

FIG. 1C is a cross-sectional view of a semiconductor device according to other example embodiments of the inventive concept, taken along lines A-A, B-B', and C-C' of FIG. 1A.

Referring to FIG. 1C, a semiconductor device according to the present embodiment may differ from that described with reference to FIG. 1B in terms of a structure of the bit line node contact DC. The bit line node contact DC may fill the bit line node hole 37. A width of the bit line node contact DC may be greater than that of the bit line BL. For example, the first spacer 39 may be solely interposed between the bit line node contact DC and the first insulating layer 27. In other words, the third spacer 47b of FIG. 1B may be omitted in the semiconductor device according to the present embodiment. The second spacer 47a may cover side surfaces of the bit line BL and a portion of a top surface of the bit line node contact DC. Except for the above-discussed features, the semiconductor device according to the present embodiment may be configured to have the same features as that of the previous embodiment described with reference to FIG. 1B.

FIGS. 2A, 3A, 4A, 5A and 6A are plan views sequentially illustrating a process of forming the semiconductor device of FIG. 1A. FIGS. 2B, 3B-3E, 4B, 4C, 5B-5E, and 6B-6H are cross-sectional views taken along lines A-A', B-B', and C-C' of the corresponding one of FIGS. 2A, 3A, 4A, 5A and 6A and show the process of forming the semiconductor device of FIG. 1A.

Figure 2A:
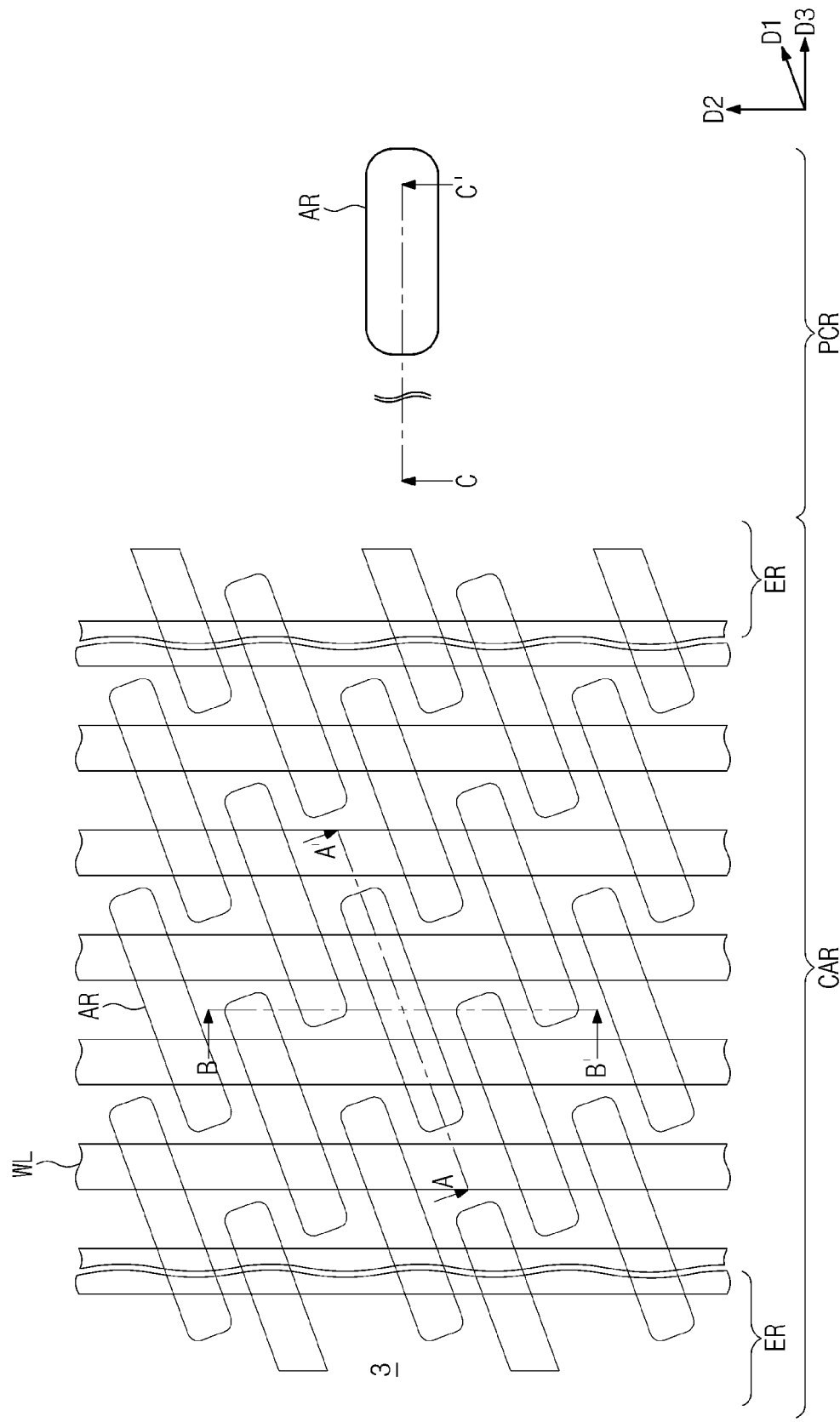

Referring to FIGS. 2A and 2B, the substrate 1 with the cell array region CAR and the peripheral circuit region PCR may be prepared. The cell array region CAR may include the cell edge region ER. The device isolation layer 3 may be formed in the substrate 1 to define the active region AR. The device isolation layer 3 may be formed using a shallow trench isolation (STI) technique. For example, the device isolation layer 3 may be formed of at least one of a silicon oxide layer, a silicon nitride layer, or a silicon oxynitride layer. An ion implantation process using an ion mask (not shown) may be performed on the active region AR of the cell array region CAR to form the first doped region 11 and the second doped region 13. In certain embodiments, the ion implantation process may be performed several times, and the second doped region 13 may be formed to have a bottom surface lower than that of the first doped region 11.

A plurality of first mask patterns 15 may be formed on the substrate 1. Each of the first mask patterns 15 may be shaped like a line pattern extending along the second direction D2.

The first mask pattern 15 may comprise, for example, silicon oxide. Furthermore, the first mask pattern 15 may be formed to cross over the active region AR and the device isolation layer 3.

The substrate 1 and the device isolation layer 3 may be patterned using the first mask pattern 15 as an etch mask to form the first groove 6 in the cell array region CAR. The first groove 6 may have a bottom surface positioned at a level higher than a bottom surface of the device isolation layer 3. The gate insulating layer 7 may be formed on a portion of the substrate 1 exposed by the first groove 6. The gate insulating layer 7 may be formed of, for example, thermal oxide. A conductive layer may be deposited in the first groove 6 provided with the gate insulating layer 7 and then be recessed to form the word line WL.

The first word line capping layer pattern 14 may be formed in the first groove 6 to cover the word line WL. The first word line capping layer pattern 14 may be formed of, for example, silicon nitride and/or silicon oxynitride. The first word line capping layer pattern 14 may be formed by depositing an insulating capping layer on the word line WL to fill the first groove 6, and then, by performing a planarization process to expose a top surface of the first mask pattern 15. As a result of the planarization process, the first word line capping layer pattern 14 may have a top surface substantially coplanar with the top surface of the first mask pattern 15. In addition, the first word line capping layer pattern 14 may have a side surface aligned with the first mask pattern 15 in a self-aligned manner. The top surface of the first word line capping layer pattern 14 may be higher than that of the substrate 1. In other words, the first word line capping layer pattern 14 may protrude above a level of the top surface of the substrate 1.

Figure 3B:
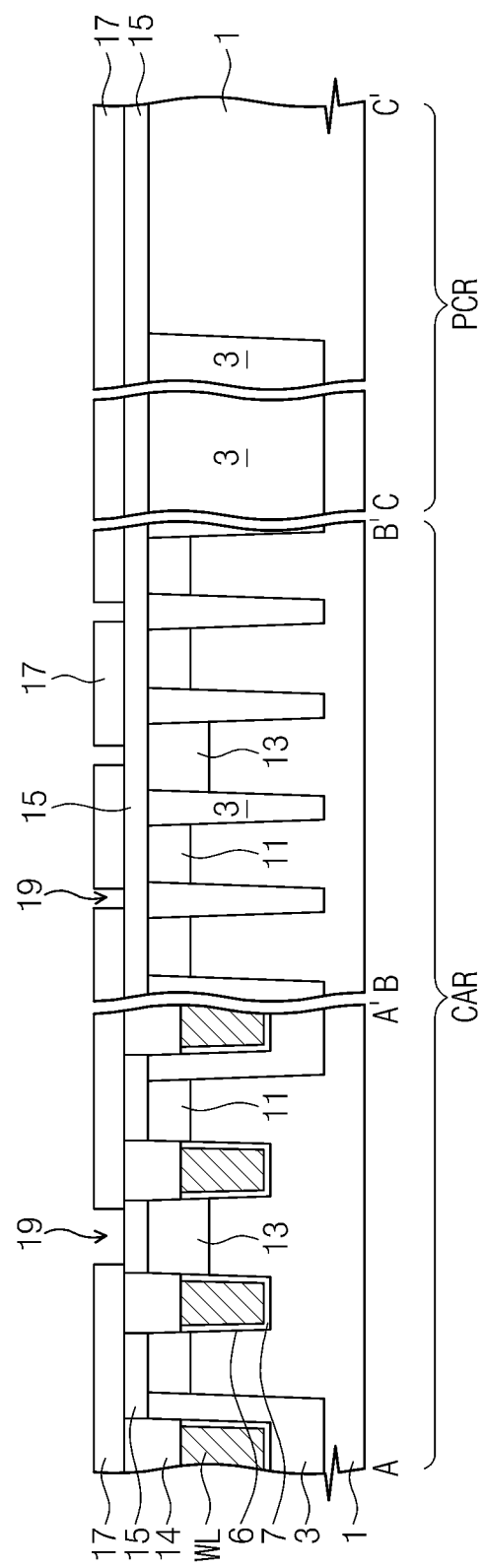

Referring to FIGS. 3A and 3B, after the formation of the first word line capping layer pattern 14, second mask patterns 17 may be formed on the substrate 1. The second mask patterns 17 may include a plurality of line-shape patterns extending along the third direction D3, crossing both of the first and second directions D1 and D2. Line-shaped openings 19 may be formed between the second mask patterns 17 to expose the first mask pattern 15 and the first word line capping layer pattern 14. The openings 19 may be connected to each other in the cell edge region ER. The second mask patterns 17 with the opening 19 may be formed using a double patterning technology. For example, a plurality of line-shaped photoresist patterns may be formed to have a minimum width, using an ArF or KrF photolithography process. Then, a first layer may be conformally formed to cover side and top surfaces of the photoresist pattern. Thereafter, a second layer may be formed on the first layer to fill spaces between the photoresist patterns and have a top surface coplanar with the uppermost surface of the first layer. Next, the first layer may be removed between the second layer and the photoresist pattern. And an underlying layer may then be etched using the second layer and the photoresist pattern as an etch mask to form the mask patterns 17.

Alternatively, a plurality of line-shaped photoresist patterns may be formed to have a minimum width, using an ArF or KrF photolithography process. Then, a first layer may be conformally formed to cover side and top surfaces of the photoresist pattern and be anisotropically etched to form spacers covering both sidewalls of the photoresist pattern. Thereafter, the photoresist patterns may be removed, and an underlying layer may be etched using the spacers as an etch mask to form the mask patterns 17.

The use of double patterning technology can overcome the limitations of the ArF or KrF photolithography process, without using an expensive EUV process. That is, the second mask patterns 17 can be formed to have a line shape defining the opening 19 and having a width smaller than the minimum width, using the ArF or KrF photolithography process.

In a conventional photolithography process, the process should be performed two times to form the conventional storage node pad having a cylindrical shape, because a space between adjacent storage node pads is too small. This increases a risk of misalignment. By contrast, according to example embodiments of the inventive concepts, it is only necessary to perform the photolithography process once. Thus, the risk of misalignment can be reduced.

Figure 3C:
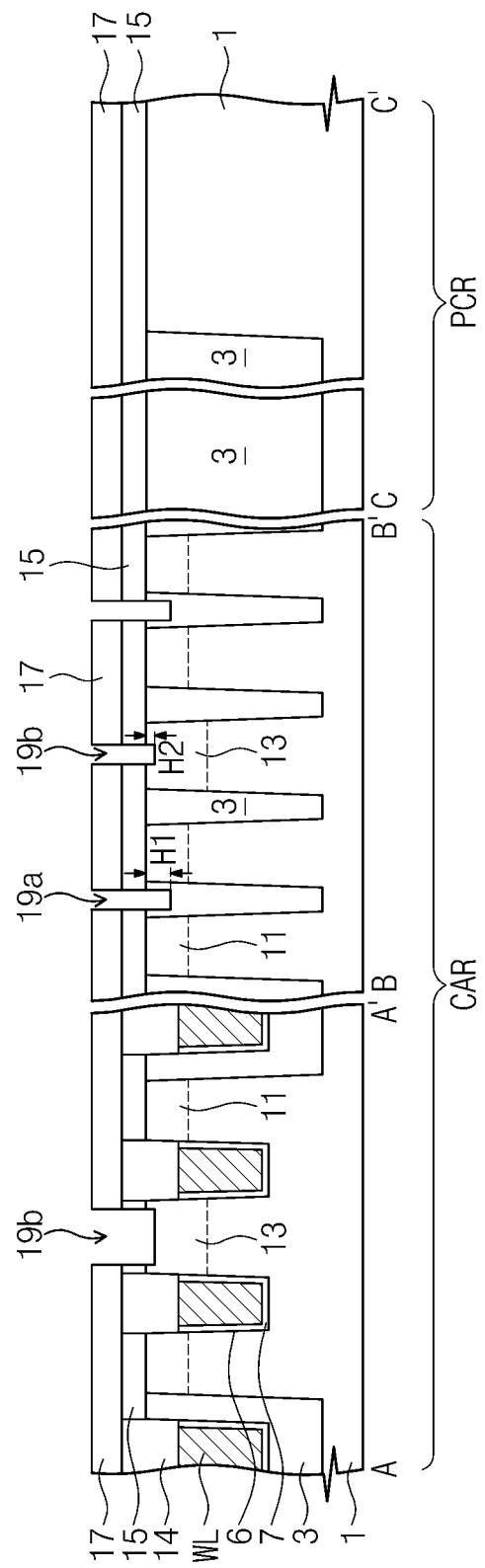

Referring to FIGS. 3A and 3C, the first mask pattern 15 and the first word line capping layer pattern 14 may be etched using the second mask patterns 17 as an etch mask to form second grooves 19a and 19b. The second grooves 19a and 19b may include a first recessed region 19a exposing a portion of the device isolation layer 3 and a second recessed region 19b exposing a portion of the active region AR of the substrate 1. Upper portions of the device isolation layer 3 and the substrate 1 exposed by the second groove 19a and 19b may be over-etched. In example embodiments, the etching process may be controlled in such a way that an etching depth in the device isolation layer 3 is greater than that in the active region AR of the substrate 1. As a result, a first height difference H1 between a bottom surface of the first recessed region 19a and the top surface of the substrate 1 may be greater than a second height difference H2 between a bottom surface of the second recessed region 19b and the top surface of the substrate 1. In example embodiments, the second height difference H2 may range from about 10 Å to about 350 Å. Although not shown in FIG. 3C, the second groove 19a, 19b may be formed in the first word line capping layer pattern 14 but may not expose the top surface of the word line WL.

Figure 3D:
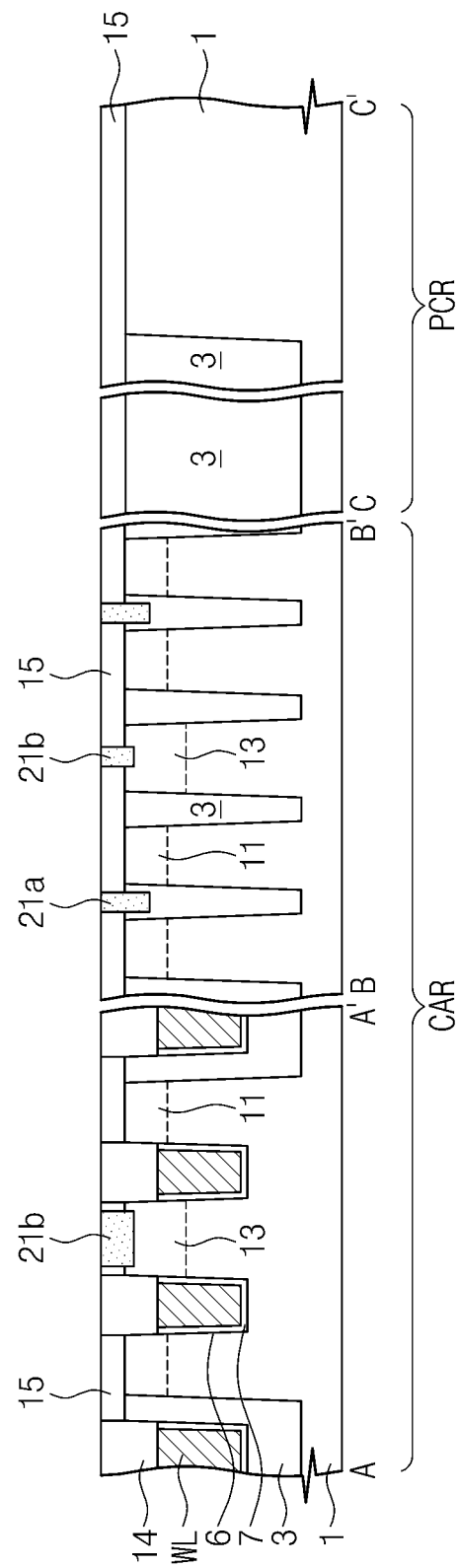

Referring to FIGS. 3A and 3D, the second mask pattern 17 may be selectively removed. An insulating isolation layer may be formed on the first mask pattern 15 to fill the second groove 19a and 19b. The isolation layer may comprise silicon nitride and/or silicon oxynitride. A planarization process may be performed on the isolation layer to expose the top surface of the first mask pattern 15 and form the isolation patterns 21a and 21b in the second groove 19a and 19b. The isolation pattern 21a and 21b may include the first isolation pattern 21a provided in the first recessed region 19a and the second isolation pattern 21b provided in the second recessed region 19b. The first isolation pattern 21a may be in contact with the device isolation layer 3, and the second isolation pattern 21b may be in contact with the second doped region 13 of the substrate 1. The dummy isolation pattern 21c may be formed on the cell edge region ER. The dummy isolation pattern 21c may be formed to have a 'U'-shaped structure in plan view and connect adjacent ones of the isolation patterns 21a and 21b to each other. The bottom surface of the first isolation pattern 21a may be lower than that of the second isolation pattern 21b. If the bottom surfaces of the first and second isolation patterns 21a and 21b are lower than the top surfaces of the device isolation layer 3 and the substrate 1, respectively, the first and second isolation patterns 21a and 21b can be positioned more stably. This allows the storage node pads, which will be formed in subsequent steps, to be electrically isolated from each other.

Although not shown in FIG. 3D, the isolation patterns 21a and 21b may be formed in the second grooves 19a, 19b in the first word line capping layer pattern 14. The isolation patterns 21a and 21b may be aligned with the first mask patterns 15 in a self-aligned manner. Furthermore, the first word line capping layer pattern 14, the first mask patterns 15, and the isolation patterns 21a and 21b may have top surfaces substantially coplanar with each other.

Figure 3E:
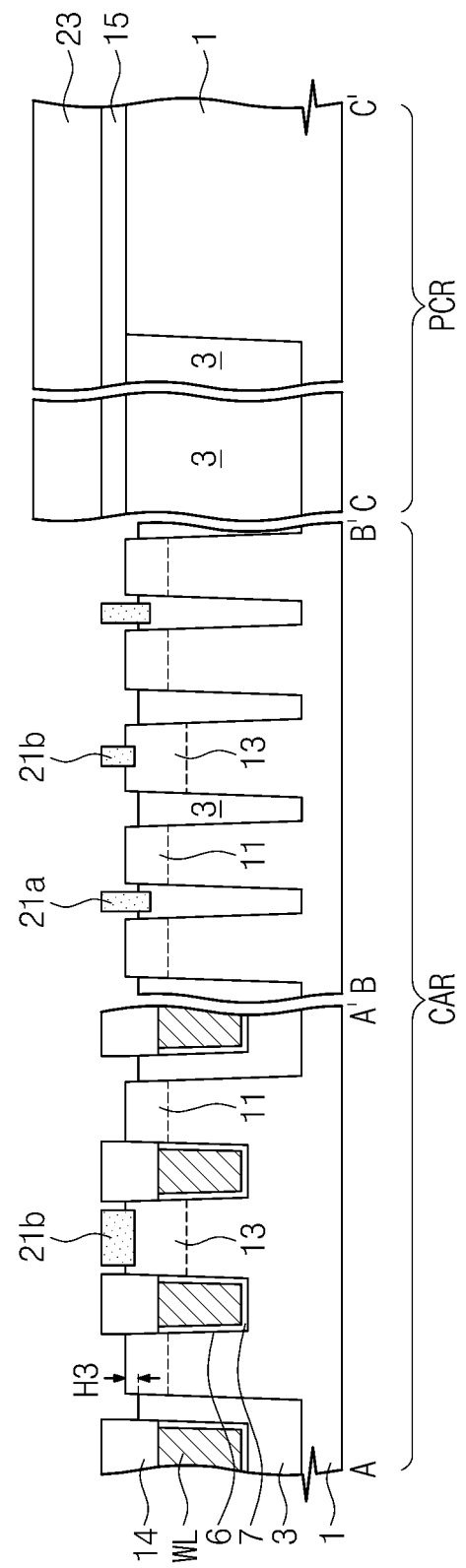

Referring to FIG. 3E, a third mask pattern 23 may be formed on the substrate 1 to cover the peripheral circuit region PCR but expose the cell array region CAR. The first mask pattern 15 may be removed using the third mask pattern 23 as an etch mask to expose sidewalls of the first word line capping layer pattern 14 and the isolation patterns 21a and 21b and expose the device isolation layer 3 and the substrate 1. If both the first mask pattern 15 and the device isolation layer 3 are formed of the same material (e.g., silicon oxide), an upper portion of the device isolation layer 3 may be partially etched during the removal of the first mask pattern 15. The first mask pattern 15 may be removed using a wet etching process. As the result of the partial etching of the upper portion of the device isolation layer 3, the device isolation layer 3 may have a top surface lower than the top surface of the substrate 1. This third height difference H3 between top surfaces of the device isolation layer 3 and the substrate 1 may be less than about 80 Å. Since the first mask pattern 15 is removed using a wet etching process, the removal process can be performed without the risk of producing etching by-products through a dry etching process. Accordingly, unlike in a dry etching process, there is no need for an over-etching process to remove etching by-products. Thus, the top portion of the device isolation layer 3 may not be excessively removed. Consequently, the top surface of the device isolation layer 3 and a bottom surface of the storage node pad to be formed thereon may not be excessively lowered. As a result, a gate-induced drain lowering (GIDL) effect can be reduced. In example embodiments, the third height difference H3 may be smaller than the first height difference H1. In this case, the remaining portion of the device isolation layer 3 may be in contact with the bottom surface and the lower sidewall of the first isolation pattern 21a. As a result, the first isolation pattern 21a may be supported by the device isolation layer 3 and it can be prevented from falling, allowing the storage node pads to be electrically isolated from each other.

Figure 3F:
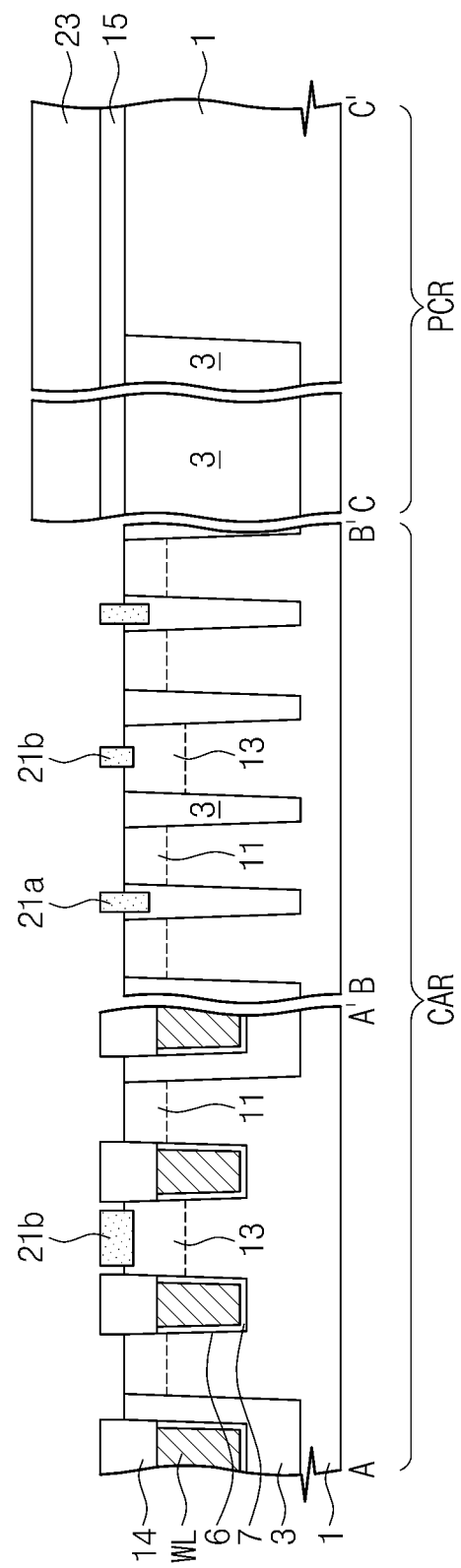

Alternatively, in other embodiments, as shown for instance in FIG. 3F, the device isolation layer 3 may be formed to have a top surface substantially coplanar with the top surface of the substrate 1. For example, the first mask pattern 15 and the device isolation layer 3 may be formed of a different material and the upper portion of the device isolation layer 3 may not be etched as much during the removal of the first mask pattern 15 as in the embodiment shown in FIG. 3E.

Figure 4A:
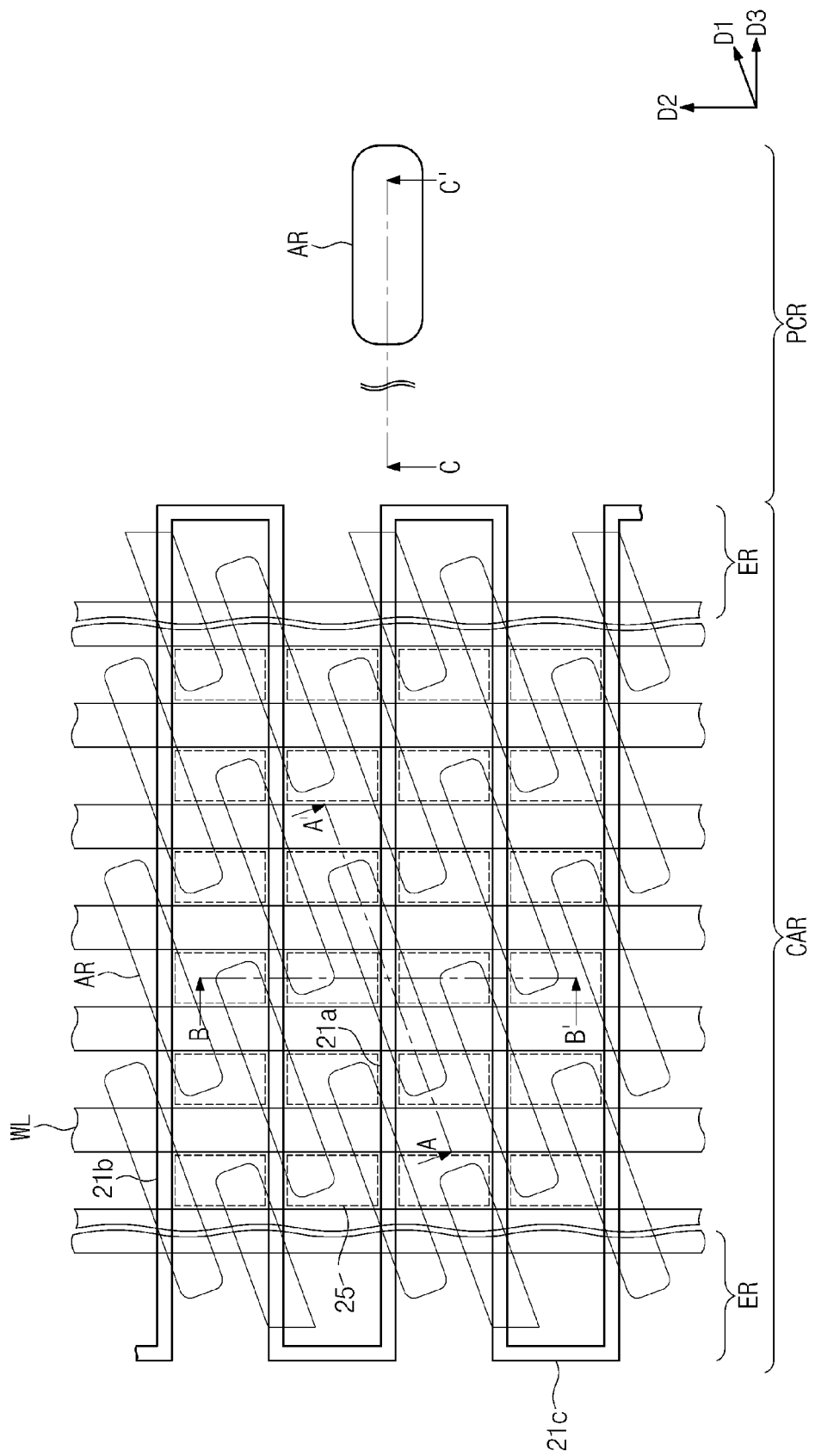

Referring to FIGS. 4A and 4B, the third mask pattern 23 may be removed to expose the first mask pattern 15 on the peripheral circuit region PCR. A conductive layer may be deposited on the substrate 1 and then planarized to expose the top surfaces of the first word line capping layer pattern 14 and the isolation patterns 21a and 21b and form a preliminary storage node pad 25 in contact with the substrate 1 between the first word line capping layer pattern 14 and the isolation patterns 21a and 21b. The conductive layer may, for example, be a doped polysilicon layer. The preliminary storage node pad 25 may be formed to interconnect the first doped region 11 with the second doped region 13 Because the preliminary storage node pad 25 is formed in a self-aligned manner with respect to the first word line capping layer pattern 14 and the isolation patterns 21a and 21b, misalignment between the second doped region 13 and the preliminary storage node pad 25 may be reduced. To prevent a void from being formed in the preliminary storage node pad 25, a deposition step and an etching step may be repeatedly performed during the formation of the conductive layer. After the formation of the preliminary storage node pad 25, the first insulating layer 27 may be formed on the substrate 1.

Figure 4C:
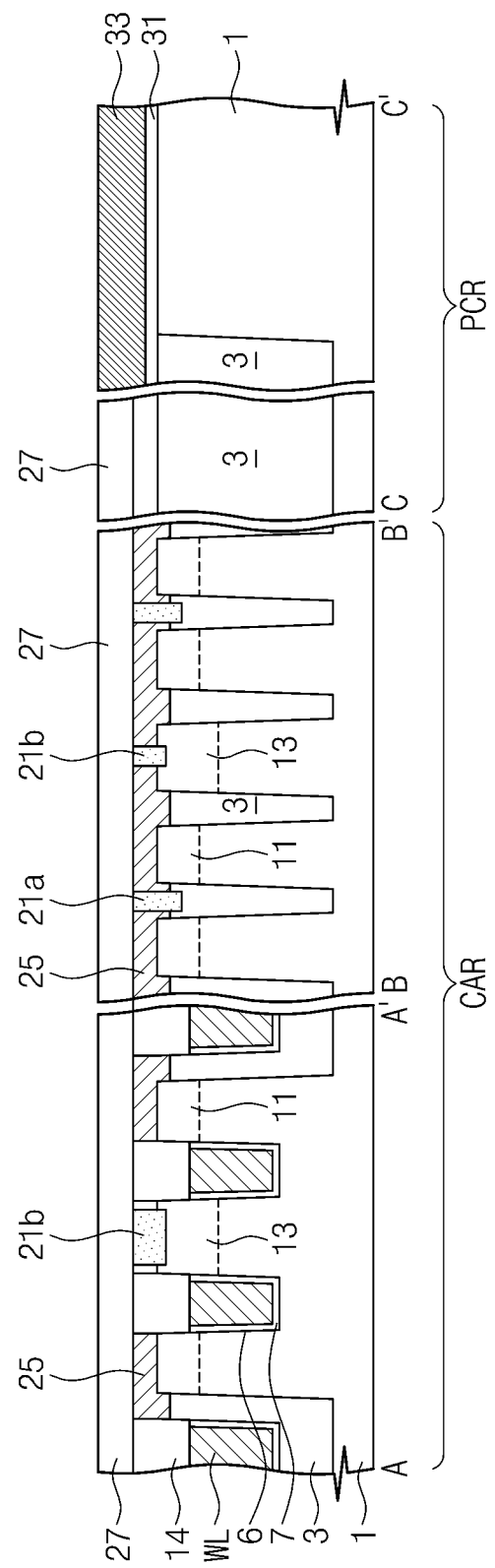

Referring to FIG. 4C, the first insulating layer 27 and the first mask pattern 15 may be removed from the peripheral circuit region PCR to expose the substrate 1. A peripheral gate insulating layer 31 and the first gate layer 33 may be formed on the substrate 1 of the peripheral circuit region PCR by performing deposition and planarization processes. The first gate layer 33 may be formed of, for example, a doped polysilicon layer. The top surface of the first gate layer 33 on the peripheral circuit region PCR may be substantially coplanar with the top surface of the first insulating layer 27 on the cell array region CAR.

Figure 5A:
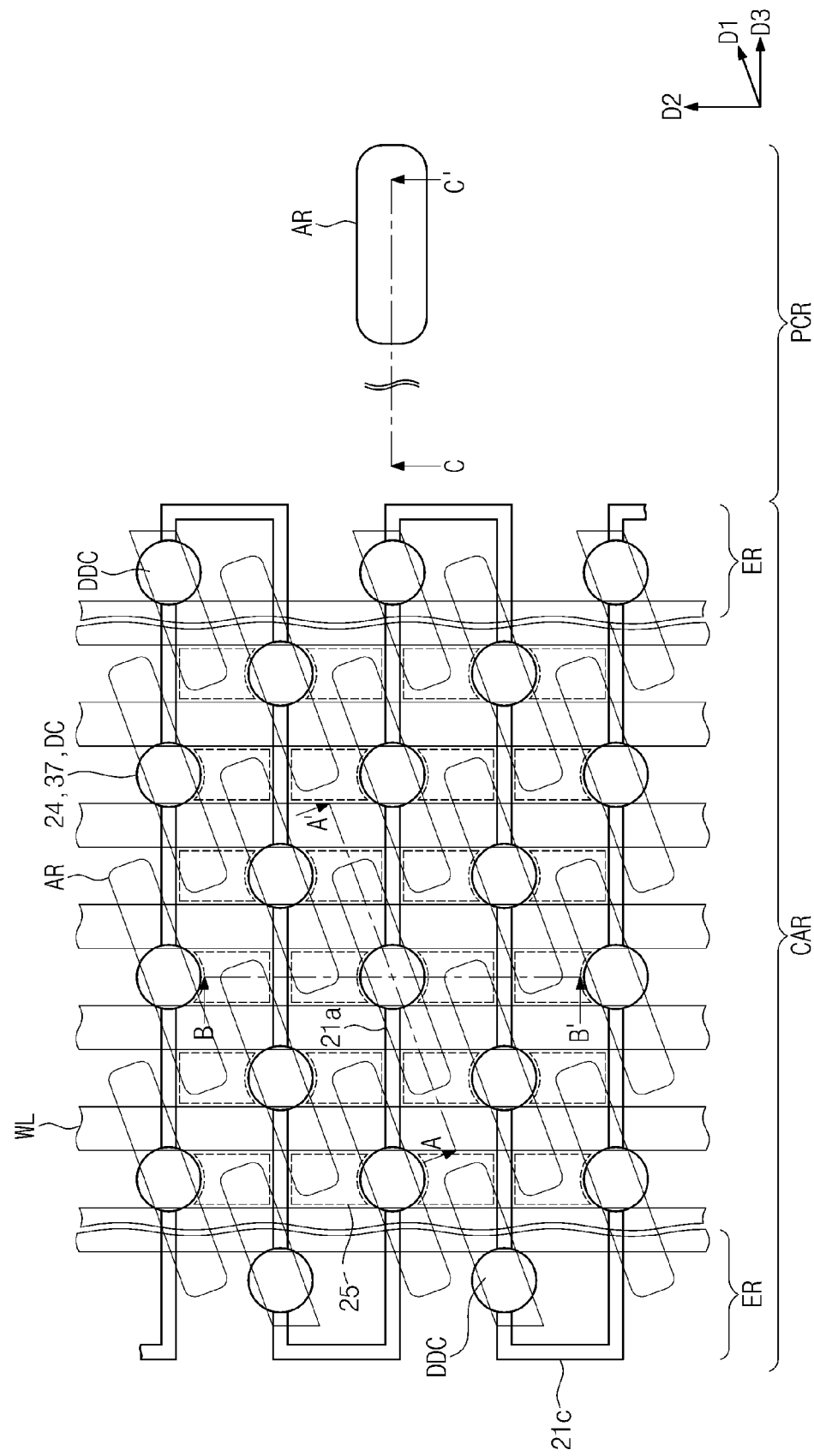

Referring to FIGS. 5A and 5B, a fourth mask pattern 35 may be formed on the substrate 1 to include a second opening 24 provided on the second doped region 13. The second opening 24 may be formed to expose the first insulating layer 27. A width of the second opening 24 may be greater than that of the second isolation pattern 21b.

Referring to FIGS. 5A and 5C, portions of the first insulating layer 27, the preliminary storage node pad 25, and the second isolation pattern 21b may be removed using the fourth mask pattern 35 as an etch mask to form the bit line node hole 37 and the storage node pad 25a. In example embodiments, the storage node pad 25a may be electrically connected to only the first doped region 11. A width of the bit line node hole 37 may be greater than a space between adjacent word line capping layer patterns 14. Thus, a sidewall of the word line capping layer patterns 14 may be partially removed during the formation of the bit line node hole 37. However, the bit line node hole 37 may be formed such that it does not expose any portion of the word line WL. A fourth height difference H4, between a bottom surface of the bit line node hole 37 and a top surface of the first word line capping layer pattern 14, may be greater than the second height difference H2. In example embodiments, the fourth height difference H4 may range from about 30 Å to about 600 Å. Accordingly, the second supporting pattern 21b may not remain on a bottom surface of the bit line node hole 37.

Figure 5D:
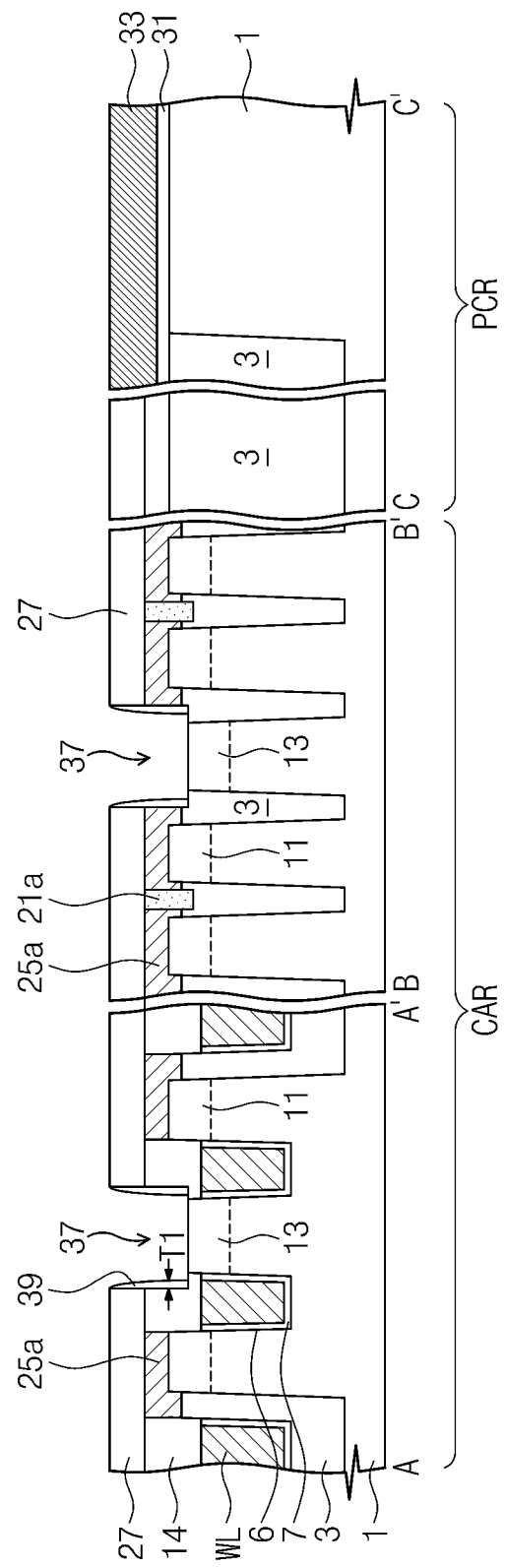

Referring to FIGS. 5A and 5D, the fourth mask pattern 35 may be removed. The first spacer 39 may be formed to cover a sidewall of the bit line node hole 37. The first spacer 39 may have a thickness T1 of about 30-300 Å.

Figure 5E:
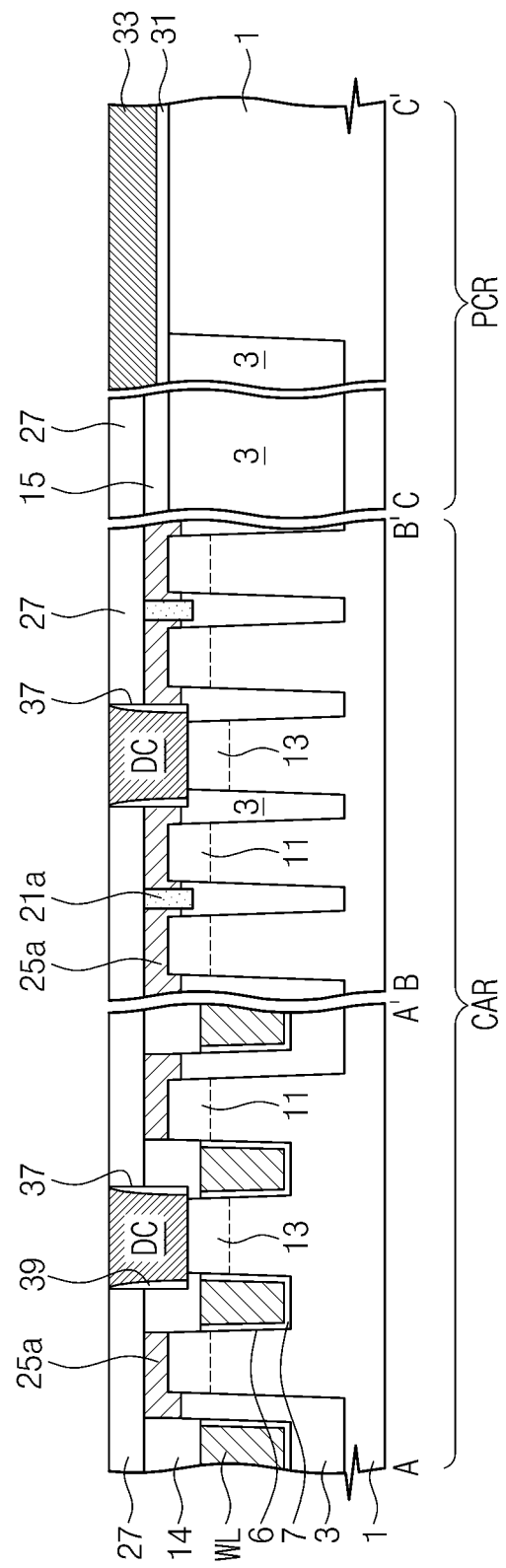

Referring to FIGS. 5A and 5E, the conductive layer may be deposited to fill the bit line node hole 37. The conductive layer may be planarized to expose the top surface of the first insulating layer 27 and form the bit line node contact DC in the bit line node hole 37. In example embodiments, the dummy bit line node contact DDC may be formed on the cell edge region ER to have substantially the same shape as the bit line node contact DC.

Figure 5F:
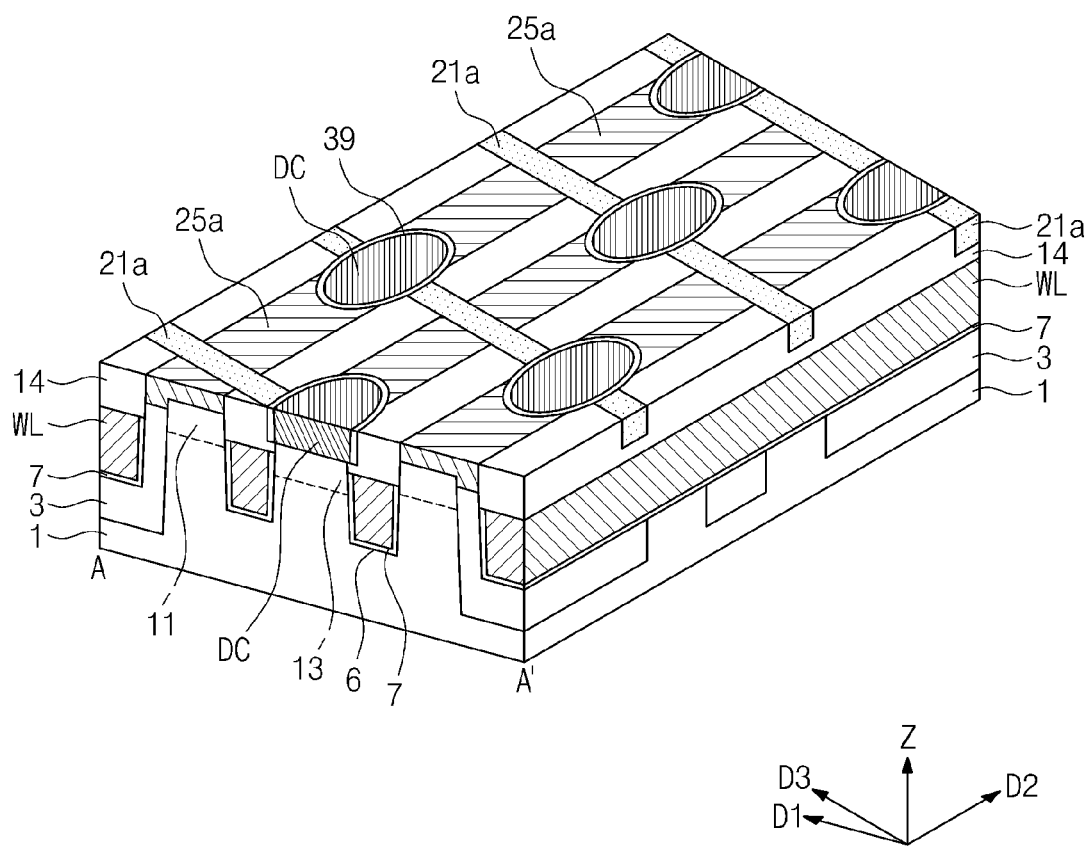
FIG. 5F is a perspective view of a semiconductor device according to one embodiment of the inventive concept.

FIG. 5F is a perspective view of the semiconductor device of FIG. 5E taken along the line A-A' of FIG. 5A and at a level of the top surface of the first word line capping layer pattern 14. Referring to FIG. 5F, the first word line capping layer pattern 14, the first isolation pattern 21a, and the first spacer 39 may be provided adjacent to the storage node pad 25a. If the first word line capping layer pattern 14, the isolation pattern 21a, and the first spacer 39 are formed of the same material (e.g., a silicon nitride layer), substantially the entire side surface of the storage node pad 25a may be surrounded with the silicon nitride layer.

Figure 6A:
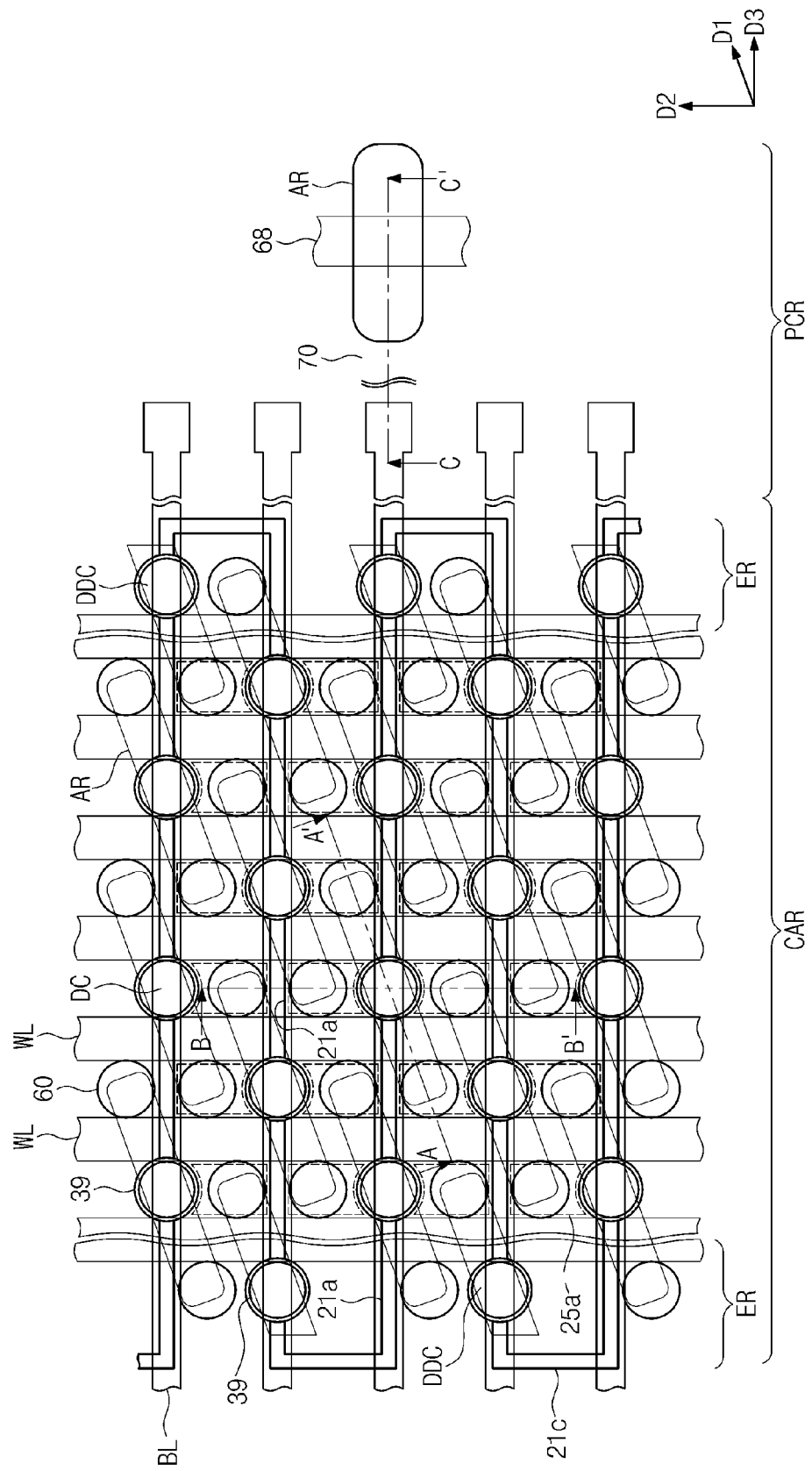
Figure 6B:
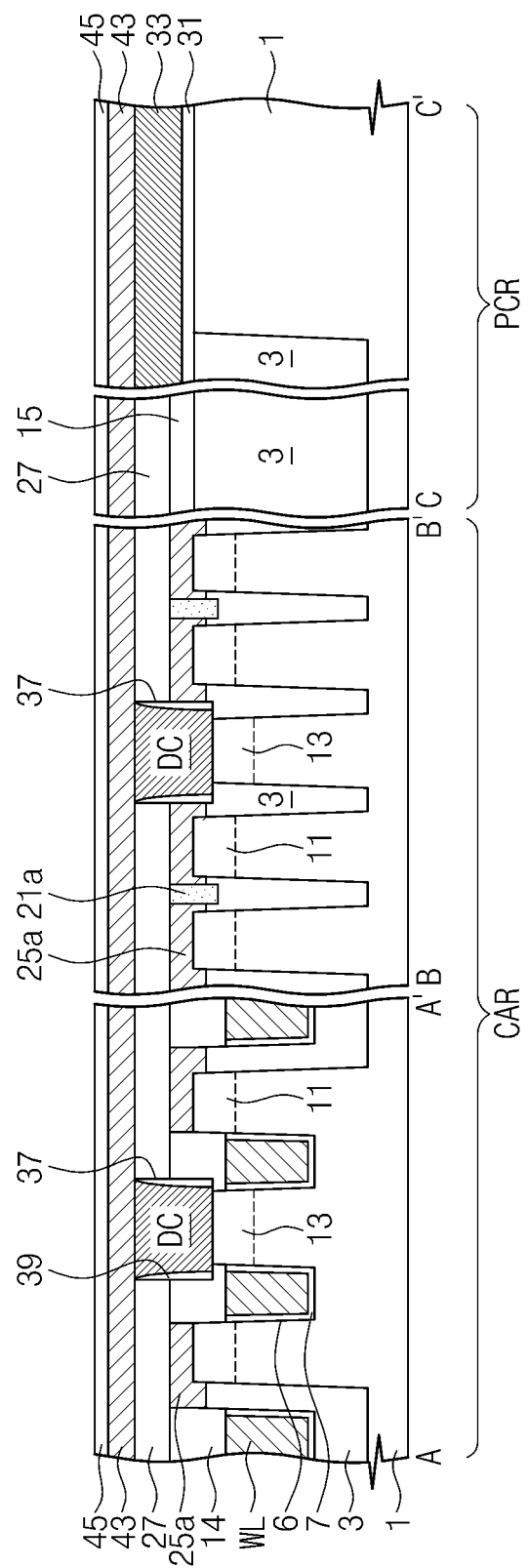

Referring to FIGS. 6A and 6B, the second gate layer 43 and the second capping layer 45 may be sequentially formed on the entire surface of the structure provided with the bit line node contact DC.

Figure 6C:
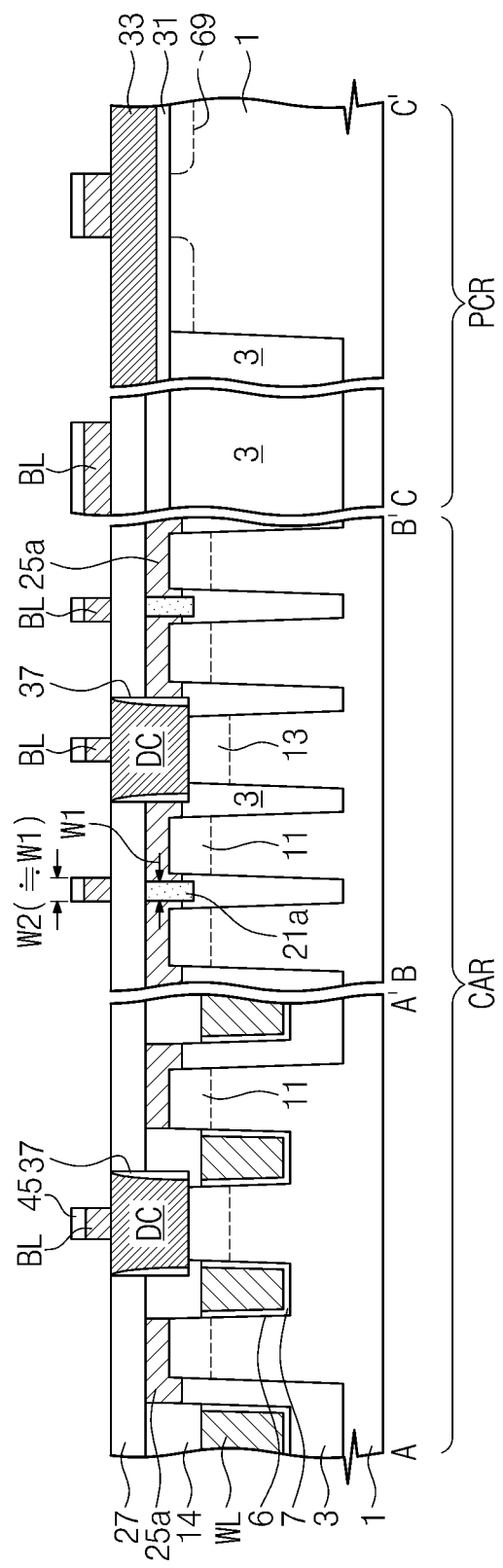

Referring to FIGS. 6A and 6C, the second word line capping layer pattern 45 and the second gate layer 43 on the cell array region CAR may be sequentially patterned to form the bit line BL and expose the top surface of the bit line node contact DC. In example embodiments, the bit line BL may be formed in such a way that a width W2 thereof may be substantially equal to the width W1 of the first isolation pattern 21a. In plan view, the bit line BL may overlap the first isolation pattern 21a, and thus, the bit line BL and the first isolation pattern 21a may have sidewalls vertically aligned with each other. The second word line capping layer pattern 45 and the second gate layer 43 may be etched in the peripheral circuit region PCR, and in this case, the top surface of the first gate layer 33 may be exposed.

Figure 6D:
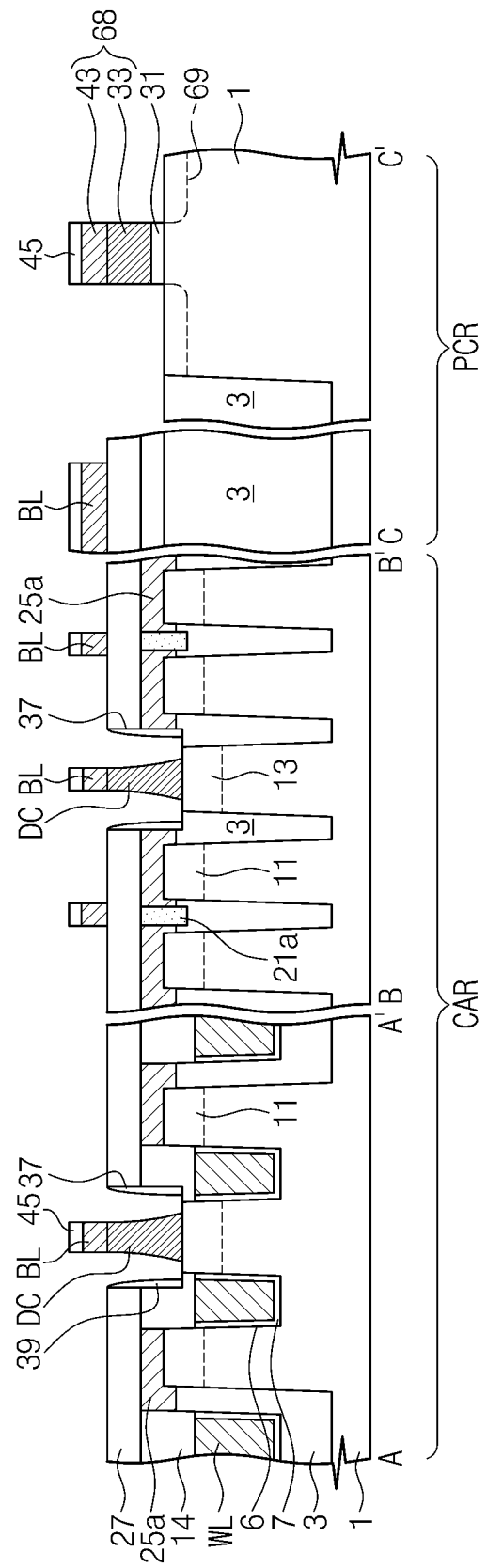

Referring to FIGS. 6A and 6D, the first gate layer 33 may be etched from the peripheral circuit region PCR to form the peripheral circuit gate electrode 68. If the first gate layer 33 and the bit line node contact DC are formed of the same material (e.g., a polysilicon layer), the bit line node contact DC may also be etched during etching the first gate layer 33. In example embodiments, the bit line node contact DC may be formed in such a way that a lower portion thereof is wider than an upper portion thereof.

Figure 6E:
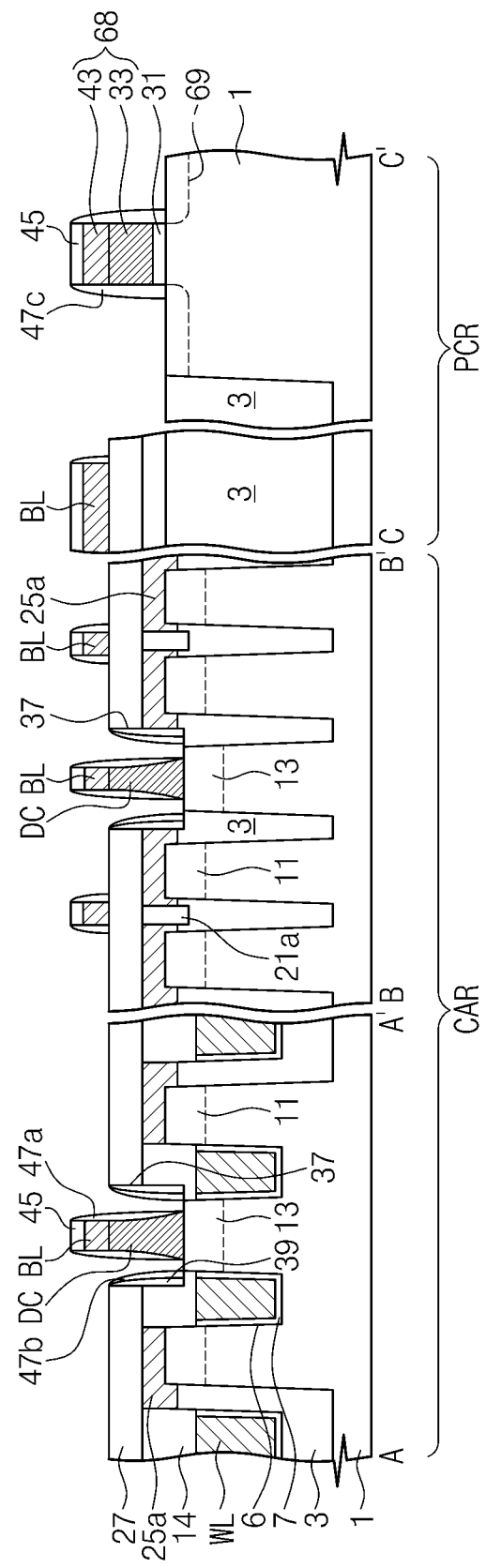

Referring to FIGS. 6A and 6E, the peripheral circuit doped region 69 may be formed in the peripheral circuit region PCR of the substrate 1. A spacer layer may be conformally formed on the resulting structure. Next, the spacer layer is anisotropically etched to form the second, third, and fourth spacers 47a, 47b, and 47c simultaneously. The second spacer 47a may be formed to cover side surfaces of the bit line BL and the bit line node contact DC, the third spacer 47b may be formed to cover a side surface or sidewall of the first spacer 39, and the fourth spacer 47c may be formed to cover a side surface or sidewall of the peripheral gate electrode 68.

Figure 6F:
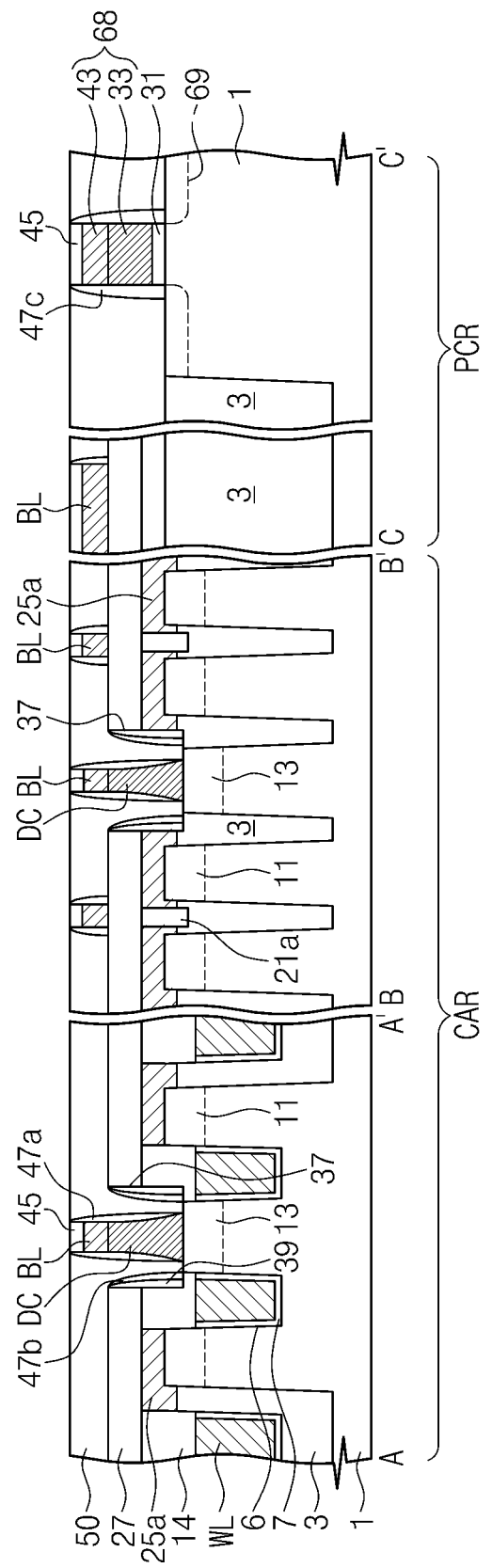
Figure 6G:
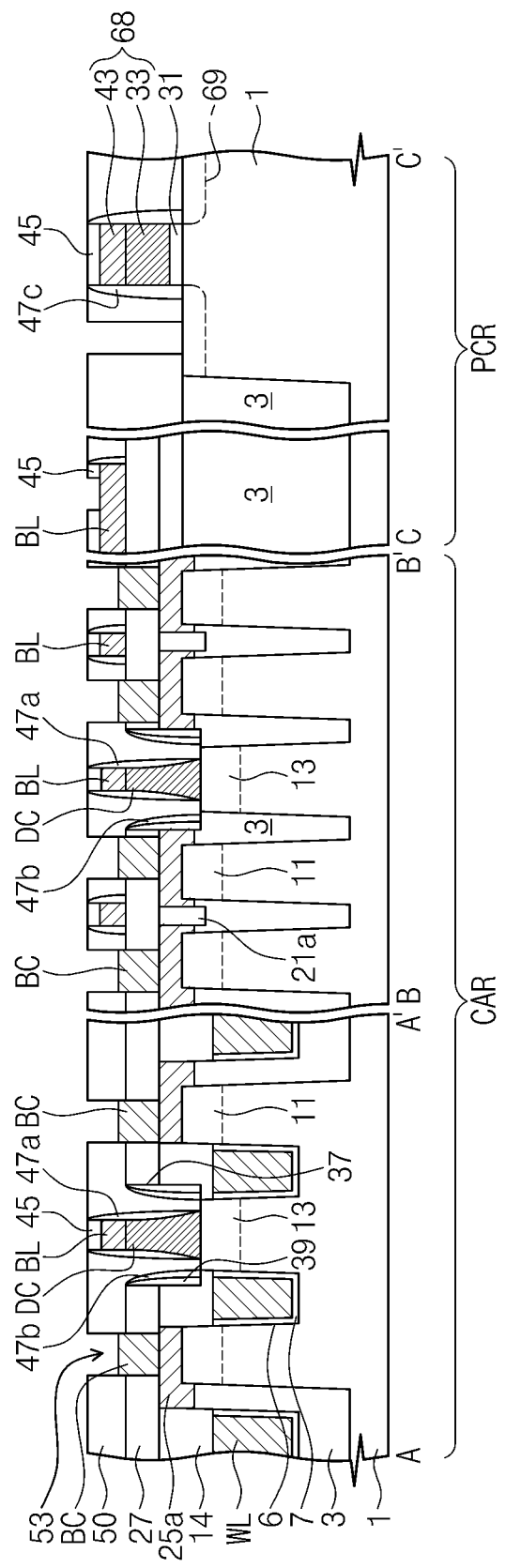

Referring to FIG. 6F, the second insulating layer 50 may be formed on the resulting structure, and then, be planarized to expose a second word line capping layer pattern 46. In the cell array region CAR, the second insulating layer 50 and the first insulating layer 27 may be patterned to form a storage node hole 53 exposing the storage node pad 25a as shown in FIG. 6G. Thereafter, the storage node contact BC may be formed by filling the storage node hole 53 with a conductive layer. Because the storage node pad 25a is formed to have an increased area, it is possible to reduce the misalignment during the formation of the storage node hole, i.e., thereby increasing the misalignment margin.

Referring again to FIG. 6G, the second word line capping layer pattern 45 may be etched in the peripheral circuit region PCR to expose a portion of the bit line BL, and the second insulating layer 50 may be etched to expose the peripheral circuit doped region 69. In example embodiments, an upper portion of the storage node contact BC may be partially removed during this etching process.

Figure 6H:
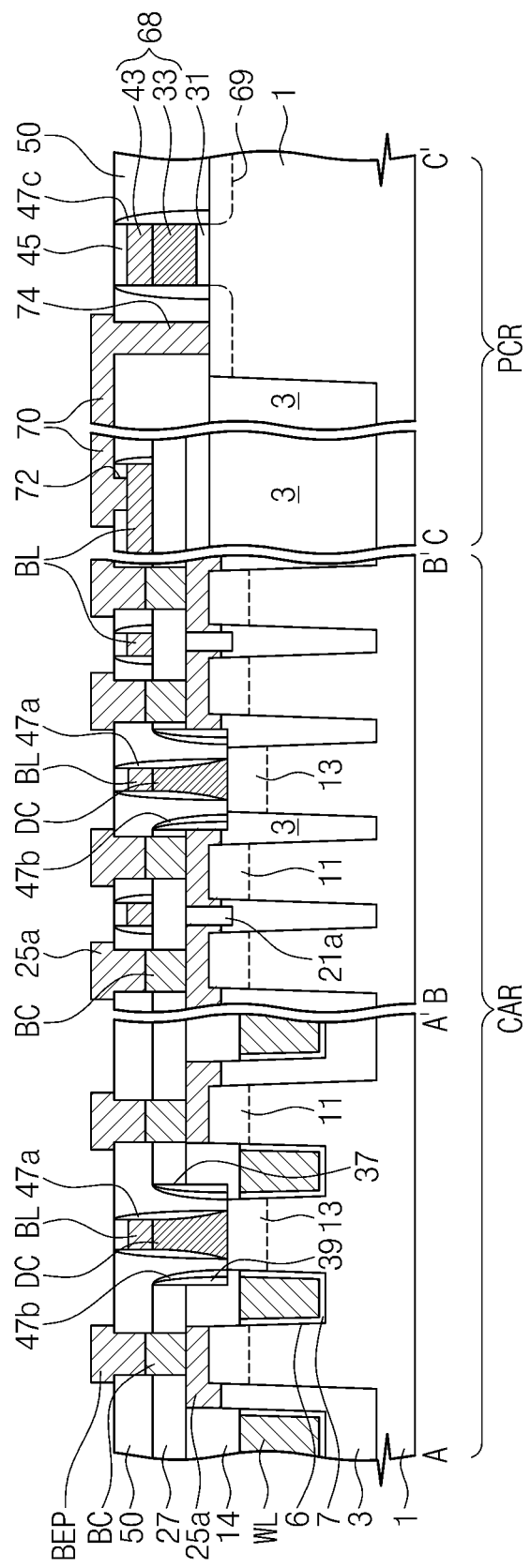

Referring to FIG. 6H, a conductive layer may be deposited and patterned to form the lower electrode pad BEP, the first and second peripheral contacts 72 and 74, and the peripheral wire 70.

Referring back to FIGS. 1A and 1B, the third insulating layer 51 may be formed on the cell array region CAR to fill a space between the lower electrode pads BEP. The etch stop layer 52 may be formed on the third insulating layer 51. Mold layers (not shown) and supporting layers 40 and 41 may be alternately formed on the etch stop layer 52. The lower electrode 60 may be connected to the lower electrode pad BEP through the supporting layers 40 and 41, the mold layers, and the etch stop layer 52. Thereafter, the mold layers may be removed. Here, the supporting layers 40 and 41 may not be removed. The dielectric 58, the upper electrode layer 56, and the plate electrode 62 may be formed on the cell array region CAR.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and/or a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 7:
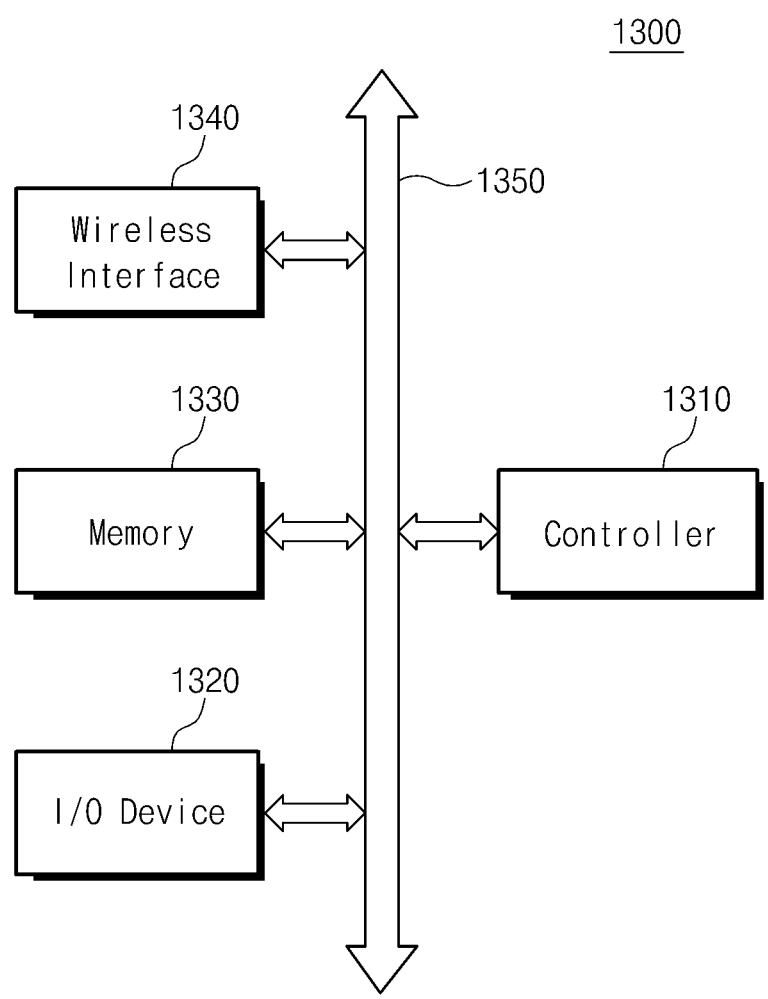
FIG. 7 is a schematic block diagram of an electronic apparatus including the semiconductor device constructed according to example embodiments of the inventive concept.

FIG. 7 is a block diagram schematically illustrating electronic devices including a semiconductor device according to example embodiments of the inventive concepts.

Referring to FIG. 7, an electronic device 1300 including a semiconductor device according to example embodiments of the inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device including a vertical channel transistor according to example embodiments of the inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 8:
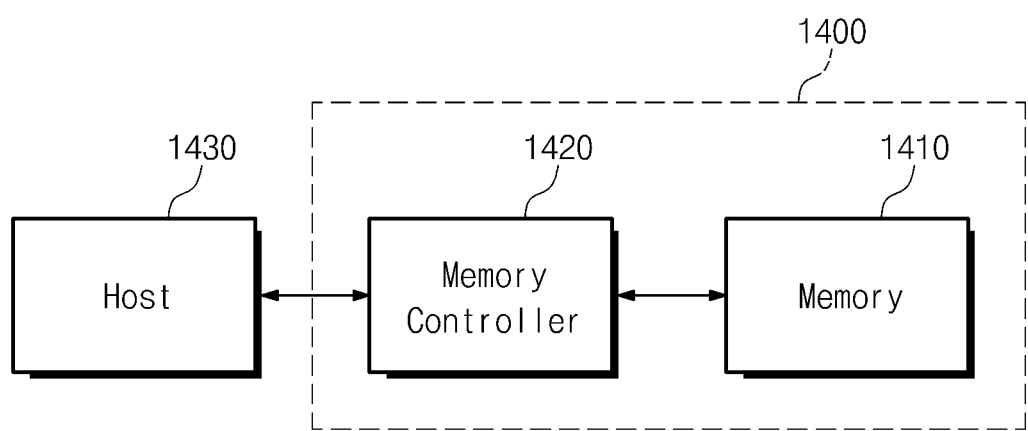
FIG. 8 is a schematic block diagram of a memory system including the semiconductor device constructed according to example embodiments of the inventive concept.

FIG. 8 is a block diagram schematically illustrating memory systems including a semiconductor device according to example embodiments of the inventive concepts.

Referring to FIG. 8, a memory system including a semiconductor device according to example embodiments of the inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device including a vertical channel transistor according to example embodiments of the inventive concept.

According to example embodiments of the inventive concepts, a semiconductor device may include storage node pads disposed adjacent to each other between word lines but spaced apart from each other by an isolation pattern. Accordingly, the storage node pads can be connected to an active region of a substrate with increased contact area, and thus, it is possible to reduce a contact resistance between the storage node pad and the substrate.

According to example embodiments of the inventive concepts, a method of fabricating a semiconductor device may include forming the storage node pads in a self-alignment manner using the isolation pattern. Accordingly, it is possible to prevent a bridge problem from being caused by a mask misalignment. This enables to improve reliability of the semiconductor device.

Furthermore, the isolation pattern may be formed using a double patterning technique, and thus, a photolithography can be performed using ArF and/or KrF beam, not EUV beam. This enables to reduce a cost for fabricating the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate having a recess partially defined by a sidewall, the substrate having a top surface on which other device elements are formed;
   a device isolation layer provided in the recess, the device isolation layer having a top surface lower than an uppermost portion of the top surface of the substrate;
   a memory element disposed on the top surface of the substrate;
   one or more first contacts electrically connected to the memory element; and
   an isolation pattern provided overlying a corresponding device isolation region and arranged between adjacent ones of the first contacts, the isolation pattern being in direct physical contact with the adjacent ones of the first contacts,
   wherein at least one of the first contacts is in contact with the top surface of the substrate and is formed such that a portion of the first contact extends downwardly into the recess along the sidewall of the recess to increase a contact area between the first contact and the substrate.

2. The device of claim 1, further comprising an interlayer insulating layer, wherein at least one of the first contacts includes a contact pad providing a bottom portion of the first contact that contacts the top surface of the substrate, wherein substantially an entire side surface of the contact pad is in contact with an insulation layer having an etch selectivity with respect to the interlayer insulating layer, and wherein the isolation pattern constitutes a portion of the insulation layer.

3. The device of claim 2, wherein the insulation layer comprises nitride.

4. The device of claim 1, wherein the device further comprises one or more spacers that are separate from the isolation pattern and arranged along one or more sidewalls of a bit line.

5. The device of claim 4, wherein at least one of the first contacts includes a contact pad providing a bottom portion of the first contact that contacts the top surface of the substrate, said contact pad having a top surface lower than a top surface of the first contact, and wherein a top surface of the isolation pattern is substantially coplanar with the top surface of the contact pad.

6. The device of claim 4, wherein a bottom surface of the isolation pattern is lower than the top surface of the substrate.

7. A semiconductor device, comprising:
   a substrate having a top surface and a recess formed in the top surface, said recess partially defined by a sidewall,
   a device isolation layer formed in the recess, wherein the device isolation layer has a top surface lower than the top surface of the substrate;
   a memory element disposed on the top surface of the substrate;
   one or more first contacts electrically connected to the memory element;
   a word line capping layer pattern adjacent to at least one of the first contacts;
   a word line extending along a first direction below the word line capping layer pattern; and
   an isolation pattern provided overlying a corresponding device isolation region and separating a top surface of the word line capping layer pattern into a plurality of portions, the isolation pattern being in contact with the word line capping layer pattern,
   wherein at least one of the first contacts is in direct physical contact with the top surface of the substrate and is formed such that a portion of the first contact extends downwardly into the recess along the sidewall of the recess to increase a contact area between the first contact and the substrate.

8. The device of claim 7, wherein the word line is provided in the substrate.

9. The device of claim 7, wherein at least one of the first contacts includes a contact pad providing a bottom portion of the first contact that contacts the top surface of the substrate, said contact pad having a top surface lower than a top surface of the first contact, and wherein a top surface of the word line capping layer pattern is substantially coplanar with the top surface of the contact pad.

10. The device of claim 7, further comprising one or more spacers that are separate from the isolation pattern and arranged along one or more sidewalls of a bit line.

11. The device of claim 10, wherein the isolation pattern has a bar-shape extending along a second direction crossing the first direction.

12. The device of claim 11, wherein a bottom surface of the isolation pattern is higher than a bottom surface of the word line capping layer pattern.

13. The device of claim 11, wherein the isolation pattern is arranged between adjacent ones of the first contacts.

14. The device of claim 1, further comprising,
   a second contact provided on a side of the first contact; and
   a spacer interposed between the first and second contacts.

15. The device of claim 14, wherein a bottom surface of the second contact is lower than a top surface of the device isolation layer.

16. The device of claim 14, further comprising,
   a conductive line extending along the first direction on the second contact, wherein the isolation pattern is provided on the other side of the first contact, and wherein the conductive line has substantially the same width as the isolation pattern and overlaps with the isolation pattern in plan view.

17. The device of claim 14, further comprising, a first doped region provided in the substrate and connected to the first contact; and a second doped region provided in the substrate and connected to the second contact, wherein the second doped region has a depth greater than that of the first doped region.

18. A semiconductor device, comprising:

a substrate having a top surface and a recess defined in the top surface, said recess having a sidewall;

a device isolation layer formed in the recess, the device isolation layer having a top surface lower than the top surface of the substrate;

a plurality of word lines provided in the substrate with a gate insulating layer interposed therebetween, the word lines extending along a first direction;

a word line capping layer pattern disposed on each of the word lines, the word line capping layer patterns protruding upward from a top surface of the substrate;

storage node pads disposed between the word line capping layer patterns to be in contact with the substrate;

isolation patterns disposed between the storage node pads and between the word line capping layer patterns; and a plurality of bit lines, each bit line having one or more spacers formed on a sidewall thereof, said spacers being separate and distinct from the isolation patterns, wherein the isolation patterns are in contact with the storage node pads and the word line capping layer patterns, and wherein the storage node pads are in contact with the top surface of the substrate and have a portion that extends downwardly into the recess along the sidewall of the recess to increase a contact area between the storage node contact pad and the substrate.

* * * * *